(12) United States Patent
Noda et al.

(10) Patent No.: US 8,766,106 B2
(45) Date of Patent: Jul. 1, 2014

(54) DOUBLE-SIDED CIRCUIT BOARD AND MANUFACTURING METHOD THEREOF

(75) Inventors: Kota Noda, Ogaki (JP); Tsutomu Yamauchi, Ogaki (JP); Satoru Kawai, Ogaki (JP)

(73) Assignee: Ibiden Co., Ltd., Ogaki-shi (JP)

(*) Notice: Subject to any disclaimer, the term of this patent is extended or adjusted under 35 U.S.C. 154(b) by 0 days.

(21) Appl. No.: 13/434,162

(22) Filed: Mar. 29, 2012

(65) Prior Publication Data
US 2012/0181076 A1    Jul. 19, 2012

Related U.S. Application Data

(62) Division of application No. 12/757,157, filed on Apr. 9, 2010, now Pat. No. 8,413,324.

(60) Provisional application No. 61/185,232, filed on Jun. 9, 2009.

(51) Int. Cl.
*H05K 1/00* (2006.01)

(52) U.S. Cl.
USPC .......................................................... 174/262

(58) Field of Classification Search
USPC .......................... 174/262–266; 361/792–795
See application file for complete search history.

(56) References Cited

U.S. PATENT DOCUMENTS

| | | | |
|---|---|---|---|
| 4,017,968 A * | 4/1977 | Weglin | .............................. 29/853 |
| 4,642,160 A | 2/1987 | Burgess | |
| 4,935,584 A | 6/1990 | Boggs | |
| 5,347,712 A | 9/1994 | Yasuda et al. | |
| 5,433,000 A | 7/1995 | Tamura et al. | |
| 5,758,413 A * | 6/1998 | Chong et al. | ..................... 29/852 |
| 6,021,564 A | 2/2000 | Hanson | |
| 2010/0307809 A1 | 12/2010 | Noda et al. | |
| 2012/0160551 A1* | 6/2012 | Liu et al. | ........................ 174/257 |

FOREIGN PATENT DOCUMENTS

| | | |
|---|---|---|
| JP | 11-186717 | 7/1999 |
| JP | 2003-347700 | 12/2003 |
| JP | 2006-041463 | 2/2006 |

OTHER PUBLICATIONS

U.S. Appl. No. 13/435,450, filed Mar. 30, 2012, Noda, et al.

* cited by examiner

*Primary Examiner* — Jeremy C Norris
(74) *Attorney, Agent, or Firm* — Oblon, Spivak, McClelland, Maier & Neustadt, L.L.P.

(57) ABSTRACT

A double-sided circuit board including a substrate having a first surface and a second surface on an opposite side of the first surface and having a penetrating hole extending between the first surface and the second surface, a first conductive circuit formed on the first surface of the substrate, a second conductive circuit formed on the second surface of the substrate, and a through-hole conductor formed in the penetrating hole of the substrate and electrically connecting the first conductive circuit and the second conductive circuit. The penetrating hole comprises a first hole having a first opening with a diameter R1 on the first surface of the substrate, a second hole having a second opening with a diameter R2 on the second surface of the substrate, and a third hole connecting the first hole and the second hole and having a diameter smaller than at least one of R1 and R2.

20 Claims, 25 Drawing Sheets

DOUBLE-SIDED CIRCUIT BOARD AND MANUFACTURING METHOD THEREOF

CROSS-REFERENCE TO RELATED APPLICATIONS

The present application is a divisional of and claims the benefit of priority to U.S. application Ser. No. 12/757,157, filed Apr. 9, 2010, which is based upon and claims the benefit of priority to U.S. Application No. 61/185,232, filed Jun. 9, 2009. The entire contents of these applications are incorporated herein by reference.

BACKGROUND OF THE INVENTION

1. Field of the Invention

The present invention is related to a circuit board, especially to a double-sided circuit board with a penetrating hole and a printed wiring board having the double-sided circuit board.

2. Discussion of the Background

From a viewpoint of enhancing electrical characteristics or the like, methods have been studied for filling with metal by plating inside a penetrating hole (through-hole) formed in a double-sided circuit board. For example, Japanese Laid-Open Patent Publication No. 2006-41463 describes that voids or the like are prevented from occurring by configuring a penetrating hole in a drum-like shape (hourglass shape).

The contents of Japanese Laid-Open Patent Publication No. 2006-41463 are incorporated herein by reference in their entirety in the present application.

SUMMARY OF THE INVENTION

According to one aspect of the present invention, a method for manufacturing a double-sided circuit board includes preparing a substrate having the first and second surfaces, forming a first hole having a first opening with a diameter R1 on the first surface of the substrate, forming a second hole having a second opening with a diameter R2 on the second surface of the substrate, forming a third hole having a diameter smaller than R1 and/or R2 and connecting the first and second holes such that a penetrating hole formed of the first hole, the second hole and the third hole is formed in the substrate, forming a first conductive circuit on the first surface of the substrate, forming a second conductive circuit on the second surface of the substrate, and filling the penetrating hole with conductive material such that a through-hole conductor electrically connecting the first conductive circuit and the second conductive circuit is formed.

According to another aspect of the present invention, a double-sided circuit board has a substrate having the first surface and the second surface on the opposite side of the first surface and having a penetrating hole extending between the first surface and the second surface, a first conductive circuit formed on the first surface of the substrate, a second conductive circuit formed on the second surface of the substrate, and a through-hole conductor formed in the penetrating hole of the substrate and electrically connecting the first conductive circuit and the second conductive circuit. The penetrating hole is formed of a first hole having a first opening with a diameter R1 on the first surface of the substrate, a second hole having a second opening with a diameter R2 on the second surface of the substrate, and a third hole connecting the first hole and the second hole and having a diameter smaller than R1 and/or R2.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
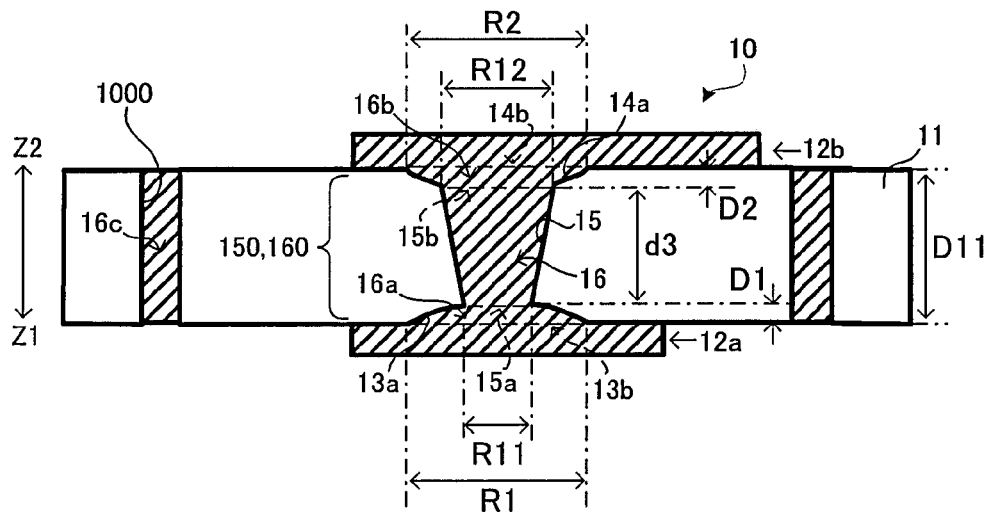
FIG. 1A is a cross-sectional view of a double-sided circuit board according to an embodiment of the present invention.

The embodiments will now be described with reference to the accompanying drawings, wherein like reference numerals designate corresponding or identical elements throughout the various drawings.

In the following, a double-sided circuit board and its manufacturing method according to embodiments of the present invention are described. In the drawings, arrows (Z1, Z2) each indicate a direction in which to laminate layers of a substrate (or a direction of the thickness of a core substrate), corresponding to the direction along a normal line of a main surface (upper or lower surface) of the substrate. On the other hand, arrows (X1, X2) and (Y1, Y2) each indicate a direction perpendicular to the lamination directions (a direction parallel to the main surfaces of the substrate). The main surfaces of the substrate are on an X-Y plane. In the following, two main surfaces facing the lamination directions opposite each other are referred to as a first surface (the surface on the arrow-Z1 side) and a second surface (the surface on the arrow-Z2 side). In addition, in the lamination directions, a layer closer to the core (insulative substrate 11) is referred to as a lower layer, and a layer farther from the core is referred to as an upper layer.

A double-sided circuit board according to the present embodiment is printed wiring board 10 as shown in FIG. 1A. Printed wiring board 10 has insulative substrate 11, conductive patterns (conductive circuits) (12a, 12b) and throughhole conductor 160. Conductive pattern (conductive circuit) (12a) is a first conductive pattern (conductive circuit), and conductive pattern (conductive circuit) (12b) is a second conductive pattern (conductive circuit).

In insulative substrate 11, penetrating hole 150 and alignment mark 1000 (penetrating hole) which penetrate insulative substrate 11 are formed. Alignment mark 1000 is used for determining positions when manufacturing printed wiring board 10. Alignment mark 1000 may be omitted unless necessary.

Penetrating hole 150 is made up of first hole (13a), second hole (14a) and third hole 15. First hole (13a) is formed in the first-surface side of insulative substrate 11. First hole (13a) has first opening (13b) of first hole (13a) on the first surface of insulative substrate 11. The width (diameter) of first opening (13b) of first hole (13a) is (R1). Second hole (14a) is formed in the second-surface side of insulative substrate 11. Second hole (14a) has second opening (14b) of second hole (14a) on the second surface of insulative substrate 11. The width (diameter) of second opening (14b) of second hole (14a) is (R2). Third hole 15 connects first hole (13a) and second hole (14a). At the interface of third hole 15 and first hole (13a) (the portion where third hole 15 and first hole (13a) are joined), third opening (15a) of third hole is formed.

(D1) is the distance from the first surface to the first joined portion where third hole 15 and first hole (13a) are joined. The first joined portion is where the inner wall of first hole (13a) and the inner wall of third hole 15 intersect. The diameter of third opening (15a) of third hole 15 is (R11). (R1) is greater than (R11), and (R1) is preferred to be greater than (D1). Also, (D1) is preferred to be smaller than thickness (D11) of insulative substrate 11. If (D1) is set in such a range, first hole (13a) will not penetrate insulative substrate 11.

On the other hand, at the interface of third hole 15 and second hole (14a) (the portion where third hole 15 and second hole (14a) are joined), fourth opening (15b) of third hole 15 is formed. (D2) is the distance from the second surface to the second joined portion where third hole 15 and second hole (14a) are joined. The second joined portion is where the inner wall of second hole (14a) and the inner wall of third hole 15 intersect. The diameter of fourth opening (15b) of third hole 15 is (R12). (R2) is greater than (R12), and (R2) is preferred to be greater than (D2). Also, (D2) is preferred to be smaller than thickness (D11) of insulative substrate 11. If (D2) is set in such a range, second hole (14a) will not penetrate insulative substrate 11.

The diameter of third hole 15 is the value of either (R11) or (R12), whichever is greater. Also, the distance from the first joined portion to the second joined portion is depth (d3) of third hole 15.

Figure 24:
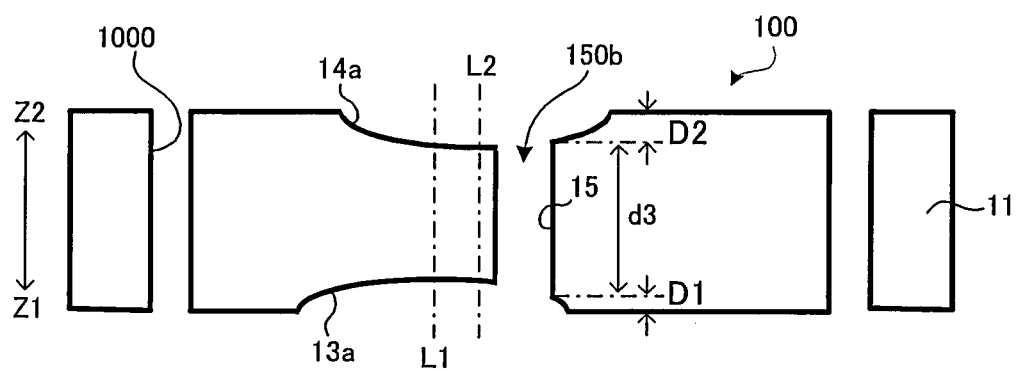
FIG. 24 is a view showing an example of a substrate where a first hole and a second hole are arranged by shifting (offsetting) their positions.

(D1), (D2) and (d3) when the first joined portion and the second joined portion are not parallel to the first surface and the second surface will be described later (see FIG. 24).

In the present embodiment, first hole (13a) and second hole (14a) have the same shape and the same dimensions, for example, and are positioned to be opposite each other.

By having symmetrical structures in first hole (13a) and second hole (14a), stresses and voids are suppressed. (D1) and (D2) are each preferred to be less than half (½) of thickness (D11) of insulative substrate 11. If (D1) and (D2) are set in such a range, even if first hole (13a) and second hole (14a) are positioned to be opposite each other, they will not penetrate insulative substrate 11. Here, first hole (13a) and second hole (14a) may also be structured asymmetrically.

In the present embodiment, (R1) is greater than (R12) or (R11); and (R2) is greater than (R12) or (R11). Accordingly, even if the position for first hole (13a) and the position for second hole (14a) are shifted from each other, penetrating hole 150 may be formed. Namely, even if straight line (L1) passing through the gravity center of first opening (13b) of first hole (13a) and perpendicular to the first surface of insulative substrate 11 (see FIG. 5C) does not coincide with straight line (L2) passing through the gravity center of second opening (14b) of second hole (14a) and perpendicular to the first surface of insulative substrate 11 (see FIG. 10C), penetrating hole 150 may be formed.

First hole (13a), second hole (14a) and third hole 15 are each filled with conductor (such as copper-plated film). Through-hole conductor 160 is made up of conductor (16a) filled in first hole (13a), conductor (16b) filled in second hole (14a) and conductor 16 filled in third hole 15. In addition, in the present embodiment, alignment mark 1000 is also filled with conductor (16c). Through-hole conductor 160 electrically connects conductive pattern (first conductive circuit) (12a) on the first surface and conductive pattern (second conductive circuit) (12b) on the second surface of insulative substrate 11.

Figure 1B:
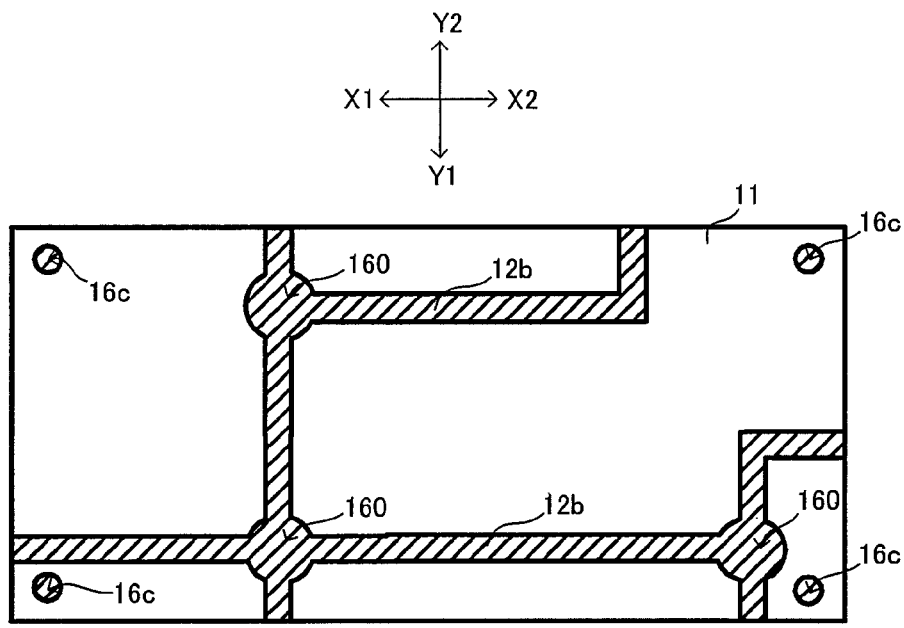
FIG. 1B is a plan view of a double-sided circuit board according to an embodiment of the present invention.

As shown in FIG. 1B, for example, conductive patterns (12a, 12b) electrically connect multiple through-hole conductors 160 in the same substrate (insulative substrate 11). However, the present invention is not limited to such, and conductive patterns (12a, 12b) may be set in any pattern.

The quality, shape, dimensions or the like of each portion of printed wiring board 10 will be outlined in detail later in descriptions of a manufacturing method.

Printed wiring board 10 will be manufactured through the following procedures.

Figure 2:
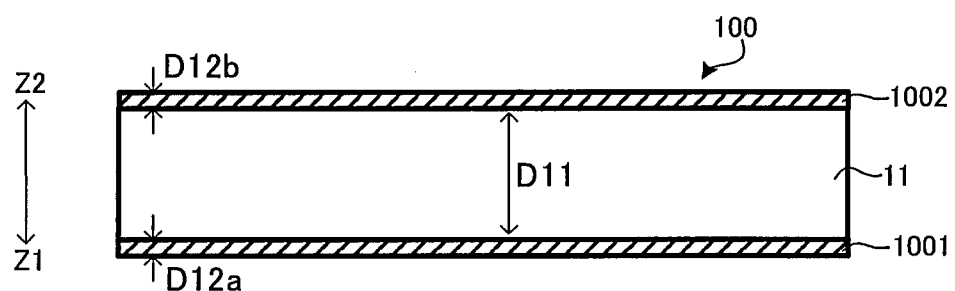
FIG. 2 is a view illustrating a step to prepare a starting substrate by a method for manufacturing a double-sided circuit board according to an embodiment of the present invention.

First, as shown in FIG. 2, substrate 1000 with conductive layers is prepared as a starting substrate. Substrate 1000 with conductive layers has insulative substrate 11 formed with a core material such as glass cloth and epoxy resin, for example, and conductive layers (1001, 1002) made of copper foil, for example. Insulative substrate 11 has a first surface and a second surface opposite the first surface. Conductive layer 1001 is formed on the first surface of insulative substrate 11, and conductive layer 1002 is formed on the second surface of insulative substrate 11.

Thickness (D11) of insulative substrate 11 is preferred to be set between 0.1 mm-0.8 mm. If the thickness is in such a range, penetrating hole 150 (FIG. 1A) may be formed easily by laser in the later process. It is more preferable for thickness (D11) of insulative substrate 11 to be set between 0.3 mm-0.4 mm. Within such a range, the strength of insulative substrate 11 may be ensured, and penetrating hole 150 (FIG. 1A) may be formed easily by laser in the later process. Thickness (D12a) of conductive layer 1001 and thickness (D12b) of conductive layer 1002 are 12 μm each, for example.

As the material for conductive layers (1001, 1002), other than copper, metals such as nickel or conductors which are not metal may also be used. However, copper foil is preferred for conductive layers (1001, 1002), and a copper-clad laminate is preferred for substrate 100 with conductive layers. In the present embodiment, a copper-clad laminate (substrate 100 with conductive layers) is used as a starting material.

Insulative substrate 11 is made of insulative material, for example, epoxy resin, polyimide resin, bismaleimide triazine resin (BT resin), allyl polyphenylene ether resin (A-PPE resin) or the like. Substrate 11 may also be an insulative substrate made with cured resin and reinforcing material. As for such reinforcing material, glass cloth, glass non-woven fabric or aramid non-woven fabric is preferred.

Figure 3A:
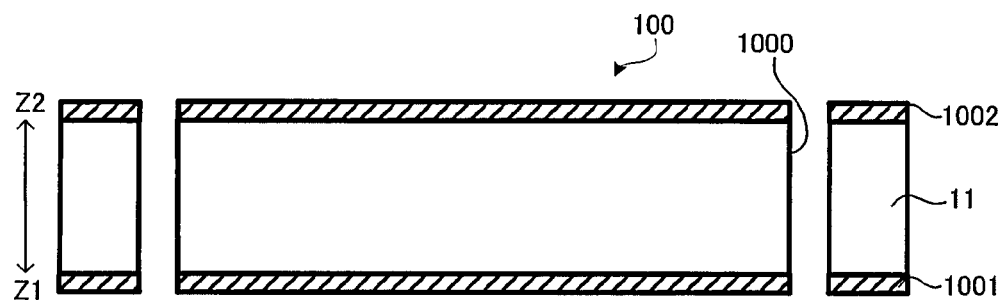
FIG. 3A is a view illustrating a step to form alignment marks.
Figure 3B:
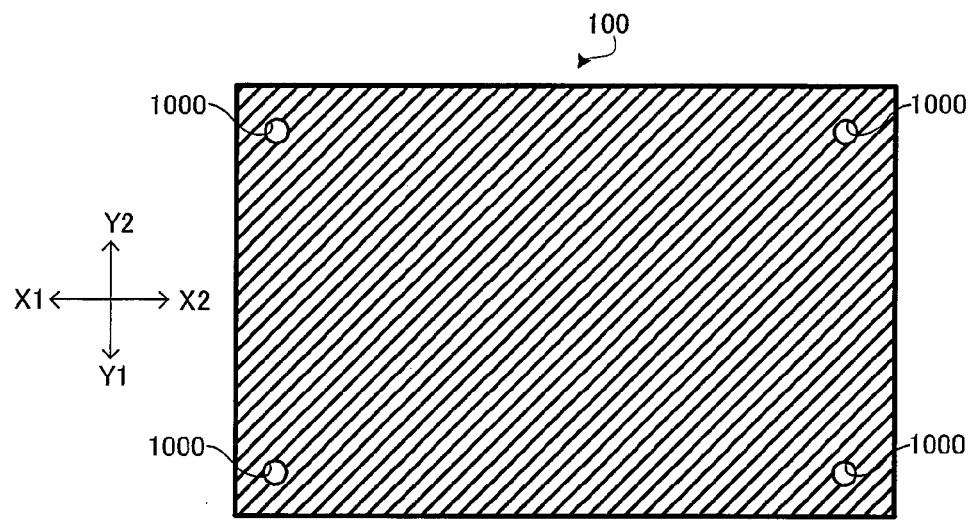
FIG. 3B is a plan view of a substrate where alignment marks are formed.

Next, as shown in FIG. 3A, alignment marks 1000 are formed in substrate 100 with conductive layers (copper-clad laminate) using a drill or laser, for example. After that, black-oxide treatment is performed on conductive layers (1001, 1002). As shown in FIG. 3B, positions for alignment marks 1000 are preferred to be set at the four corners of substrate 100 with conductive layers. Alignment marks 1000 are preferred to be holes that penetrate insulative substrate 11. However, alignment marks 1000 are not limited to such and they may be formed as non-penetrating holes as well.

Figure 4:
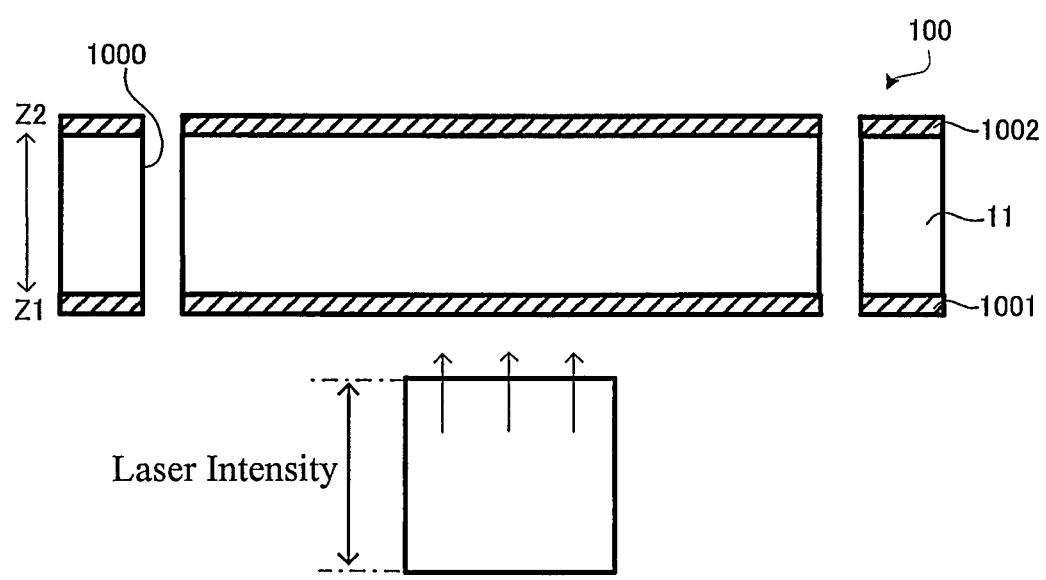
FIG. 4 is a view illustrating a step to form a first hole.
Figure 5A:
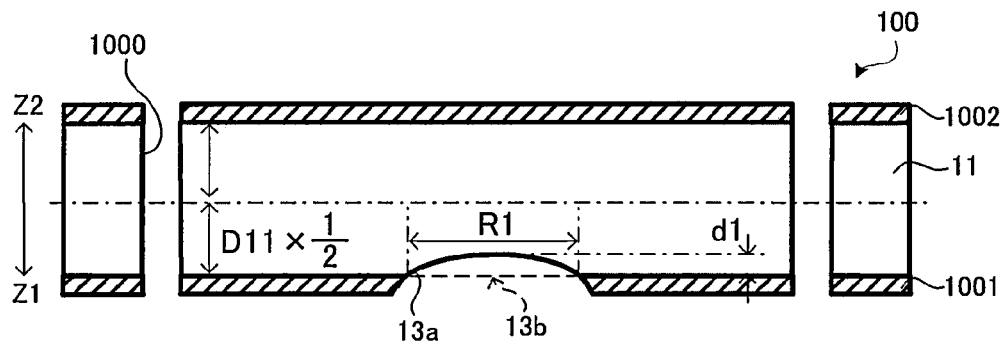
FIG. 5A is a cross-sectional view of a substrate where a first hole is formed.

Next, substrate 100 with conductive layers is set in laser processing equipment. Then, as shown in FIG. 4, for example, conductive layer 1001 is irradiated with a laser. Accordingly, as shown in FIG. 5A, first hole (13a) is formed in the first-surface side of insulative substrate 11. The spot to irradiate a laser is determined based on alignment marks 1000. Then, a laser is irradiated at the position designed to form penetrating hole 150 (FIG. 1A) in the later process (hereinafter referred to as a position designed for a penetrating hole).

Figure 5B:
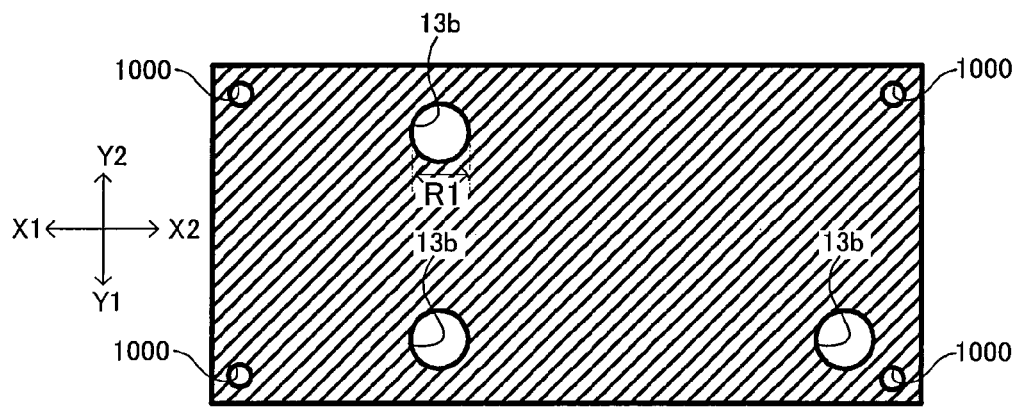
FIG. 5B is a plan view of a substrate where first holes are formed.

As shown in FIG. 5B, first hole (13a) is formed in each of multiple positions designed for penetrating holes, for example. However, the number of positions designed for penetrating holes is not limited specifically and it may be one. The shape of first opening (13b) of first hole (13a) is circular, for example. FIG. 5A is a cross-sectional view obtained by slicing the substrate with a plane that passes through the gravity center of first opening (13b) of first hole (13a) and is perpendicular to the first surface of insulative substrate 11. As shown in FIG. 5A, the depth of first hole (13a) is (d1). Depth (d1) of first hole (13a) is preferred to be less than half of thickness (D11) of insulative substrate 11. Depth (d1) of first hole (13a) is preferred to be between one-thirtieth (1/30) of (D11) and one-third (1/3) of (D11). Width (R1) (diameter) of first opening (13B) is 80 μm, for example. Width (R1) is preferred to be set between 60-100 μm.

Figure 5C:
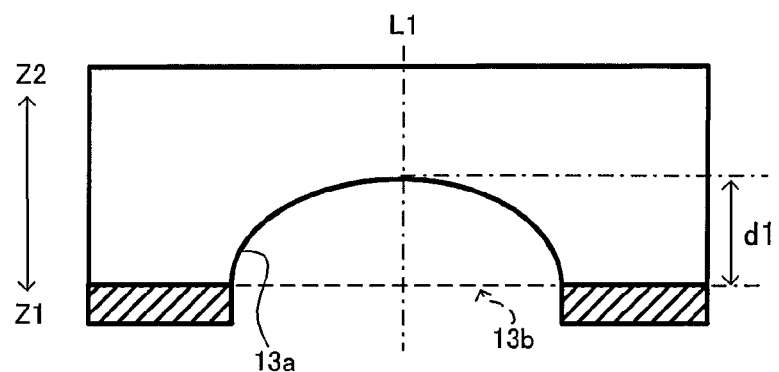
FIG. 5C is a magnified view showing part of FIG. 5A.

As shown in FIG. 5C, the inner wall of first hole (13a) is tapered. In the present embodiment, the wall surface of first hole (13a) is curved where a width (diameter) of first hole (13a) gradually (for example, exponentially) decreases from the first surface of insulative substrate 11 toward the second surface. Namely, tapering of first hole (13a) from the first surface of insulative substrate 11 toward the second surface includes cases in which the inner wall of first hole (13a) gradually narrows from the first surface of insulative substrate 11 toward the second surface.

Figure 6A:
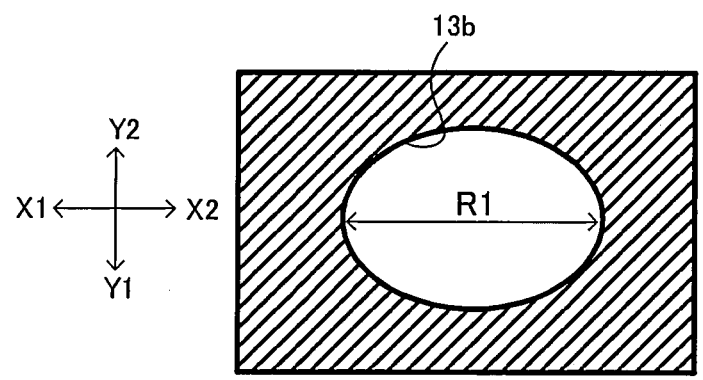
FIG. 6A is a view showing a first modified example of an opening (first opening) of a first hole in the first-surface side.
Figure 6B:
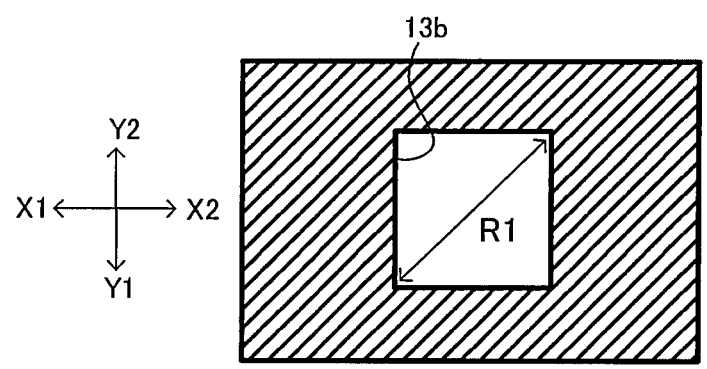
FIG. 6B is a view showing a second modified example of an opening (first opening) of a first hole in the first-surface side.

The shape of first opening (13b) of first hole (13a) is not limited to being circular, and any other shape may be employed. For example, as shown in FIG. 6A, the shape of first opening (13b) may be oval. In such a case, width (R1) of first opening (13b) corresponds to the major axis. Also, as shown in FIG. 6B, for example, first opening (13b) may be shaped to have four sides. In such a case, width (R1) of first opening (13b) corresponds to the diagonal distance. Other than those, first opening (13b) may also be shaped as a triangle, or as a polygon such as one with six sides.

Figure 7A:
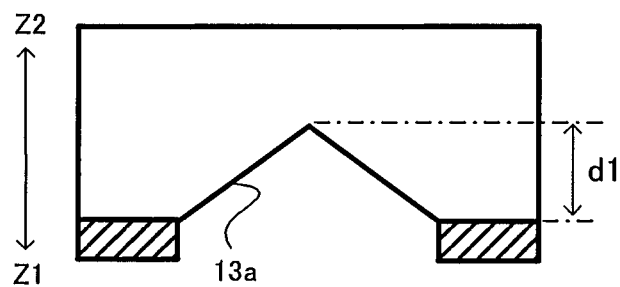
FIG. 7A is a view showing a first modified example of a shape of a first hole.
Figure 7B:
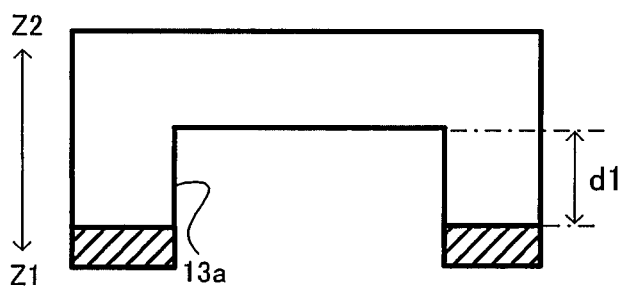
FIG. 7B is a view showing a second modified example of a shape of a first hole.

The wall surface of first hole (13a) is not limited to being curved, as shown in FIG. 5C. For example, as shown in FIG. 7A, it may be inclined. Namely, tapering of first hole (13a) from the first surface of substrate 100 with conductive layers toward the second surface includes cases in which the diameter of first hole (13a) decreases in a straight line from the first surface toward the second surface. In addition, first hole (13a) is not required to be tapered; for example, as shown in FIG.

7B, the wall surface of first hole (13a) may be perpendicular to the first surface of substrate 100 with conductive layers.

In the following, examples of a method for forming tapered first hole (13a) are shown.

As shown earlier in FIG. 4, for example, by directly irradiating conductive layer 1001 with a laser, tapered first hole (13a) may be formed as shown earlier in FIG. 5C. FIG. 4 schematically shows laser intensities (energy). In an example shown in FIG. 4, the laser intensities are substantially uniform.

Figure 8A:
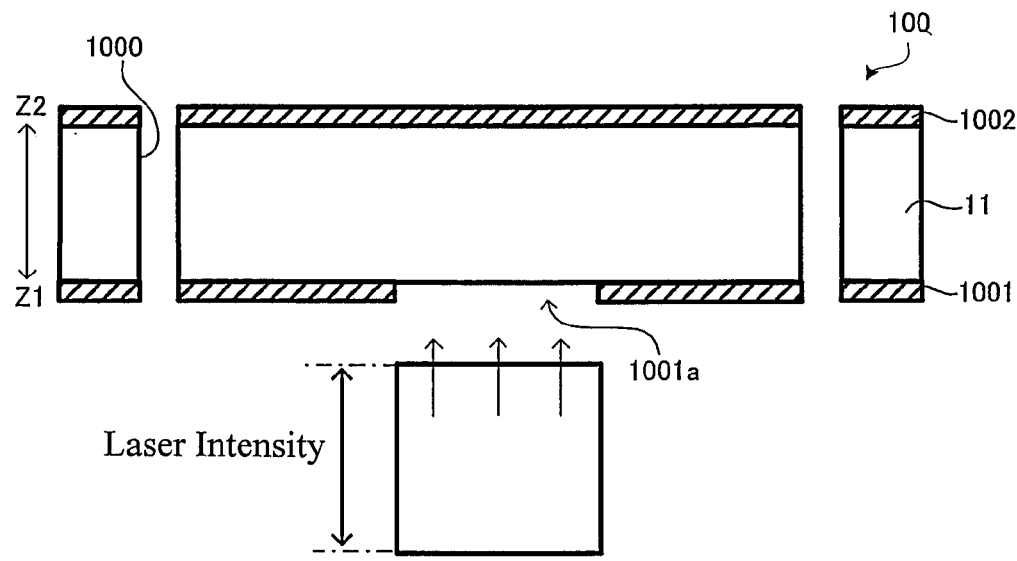
FIG. 8A is a view showing a first modified example of a step to form a first hole.

However, the above is not the only method. For example, as shown in FIG. 8A, by forming opening (1001a) in conductive layer 1001 and by irradiating a laser at insulative substrate 11 exposed through opening (1001a), tapered first hole (13a) may be formed as shown earlier in FIG. 5C. This is a so-called conformal-mask method. FIG. 8A schematically shows laser intensities (energy). In an example shown in FIG. 8A, the laser intensities are substantially uniform.

Figure 8B:
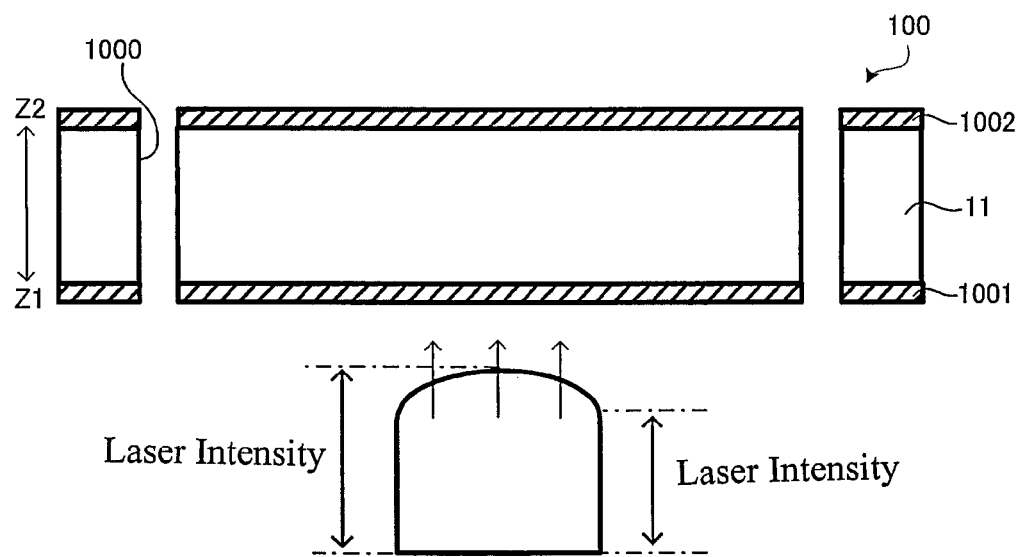
FIG. 8B is a view showing a second modified example of a step to form a first hole.

Also, as shown in FIG. 8B, for example, by irradiating substrate 100 with conductive layers or insulative substrate 11 using a laser with energy that is higher in the center than on the periphery, tapered first hole (13a) may be formed as shown earlier in FIG. 5C. FIG. 8B schematically shows laser intensities (energy). In an example shown in FIG. 8B, laser energy is stronger in the center than on the periphery. Laser intensity decreases exponentially from the center toward the periphery. When forming tapered first hole (13a), such a distribution of laser intensity is preferred.

By irradiating multiple pulses of laser, first hole (13a) may be formed. In such a case, the laser diameter of the final pulse is preferred to be smaller than the laser diameter of the first pulse. By using a laser whose energy density is higher in the center than on the periphery for the final pulse, tapered first hole (13a) may be easily formed.

The number of shots of laser irradiation may be one or multiple. However, by irradiating a laser multiple times, it is easier to adjust the shape and depth (d1) of first hole (13a).

By adjusting the size of a mask of laser processing equipment or a mask of a conformal-mask method, the size of (R1) may be modified.

Figure 9:
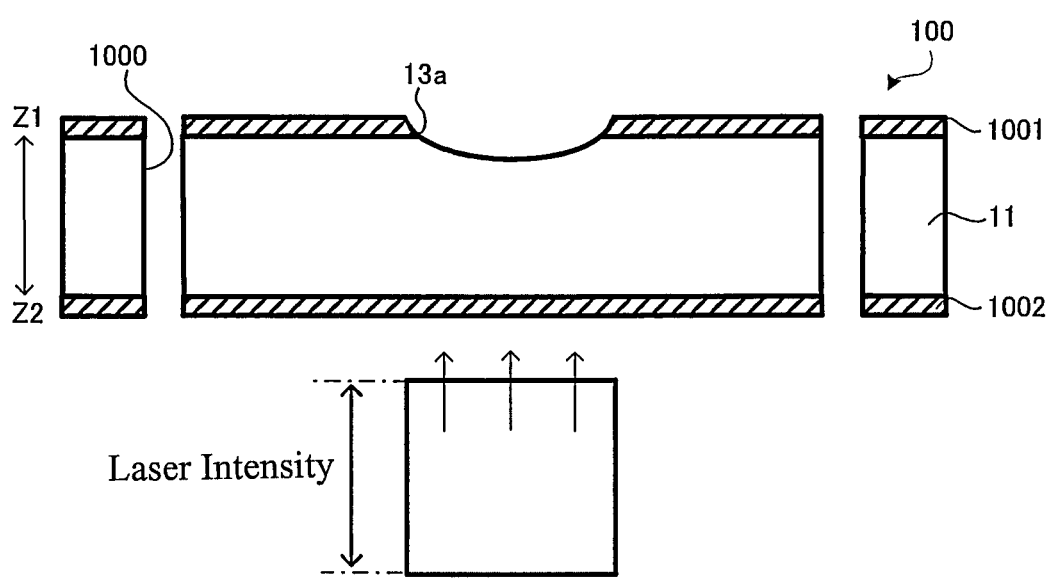
FIG. 9 is a view illustrating a step to form a second hole.
Figure 10A:
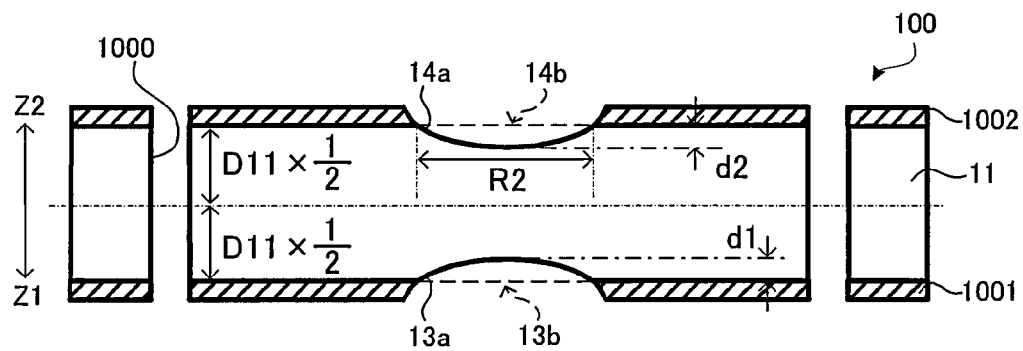
FIG. 10A is a cross-sectional view of a substrate where a second hole is formed.
Figure 10B:
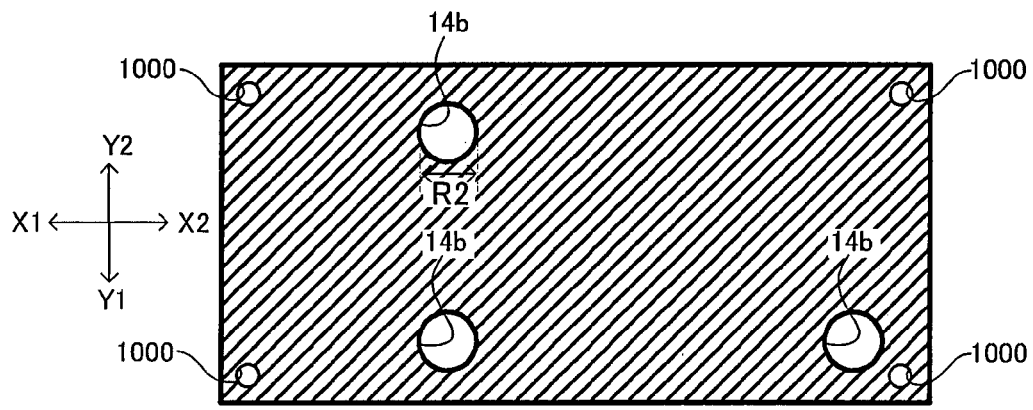
FIG. 10B is a plan view of a substrate where second holes are formed.

Next, substrate 100 with conductive layers is inverted and substrate 100 with conductive layers is set in laser processing equipment. Then, as shown in FIG. 9, for example, a laser is irradiated on conductive layer 1002 of substrate 100 with conductive layers. By doing so, as shown in FIG. 10A, second hole (14a) is formed in a position opposite first hole (13a). Second hole (14a) is formed in the second-surface side of insulative substrate 11. The spot to irradiate a laser is aligned with a position designed for a penetrating hole, based on alignment marks 1000. Namely, a laser is irradiated at the position opposite first hole (13a). In doing so, second hole (14a) is formed in a position designed for a penetrating hole as shown in FIG. 10B. By forming first hole (13a) and second hole (14a) based on the same alignment marks 1000, their positional accuracy is enhanced.

The shape of second opening (14b) of second hole (14a) is circular, for example. FIG. 10A is a cross-sectional view obtained by slicing the substrate with a plane that passes through the gravity center of the second opening of second hole (14a) and is perpendicular to the first surface of insulative substrate 11. As shown in FIG. 10A, the depth of second hole (14a) is (d2). Depth (d2) of second hole (14a) is preferred to be less than half (½) of thickness (D11) of insulative substrate 11. Depth (d2) of second hole (14a) is preferred to be between one-thirtieth (1/30) of (D11) and one-third (⅓) of (D11). Width (R2) (diameter) is 80 μm, for example. Width (R2) is preferred to be set between 60-100 μm.

Figure 10C:
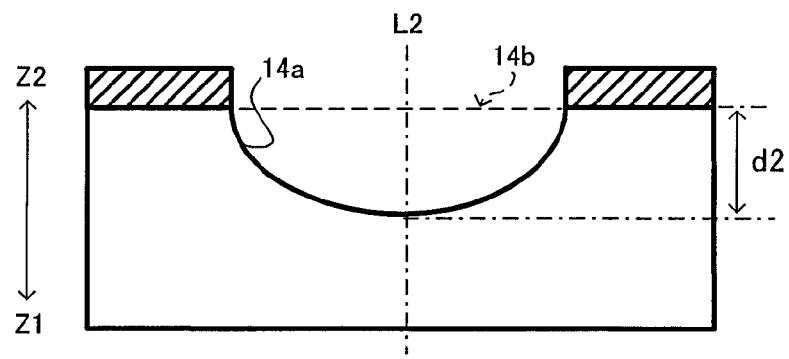
FIG. 10C is a magnified view showing part of FIG. 10A.

As shown in FIG. 10C, second hole (14a) is tapered. In the present embodiment, the wall surface of second hole (14a) is curved where a width (diameter) of second hole (14a) gradually (for example, exponentially) decreases from the second surface of insulative substrate 11 toward the first surface. Namely, tapering of second hole (14a) from the second surface of insulative substrate 11 toward the first surface includes cases in which the inner wall of second hole (14a) gradually narrows from the second surface of insulative substrate 11 toward the first surface.

Figure 11A:
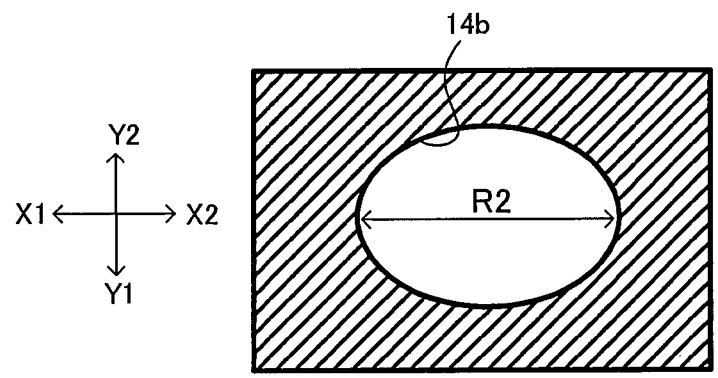
FIG. 11A is a view showing a first modified example of an opening (second opening) of a second hole in the second-surface side.
Figure 11B:
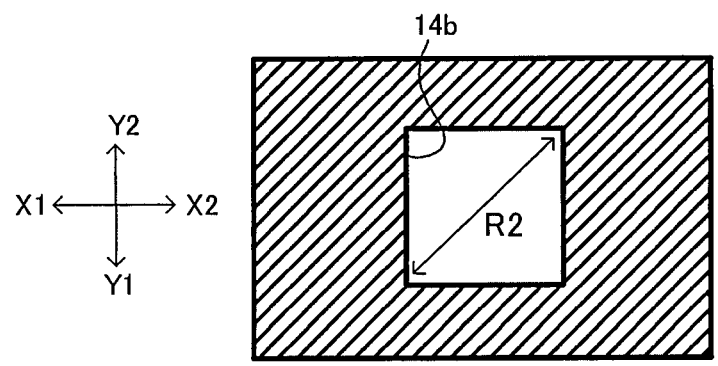
FIG. 11B is a view showing a second modified example of an opening (second opening) of a second hole in the second-surface side.

The shape of second opening (14b) of second hole (14a) is not limited to a circle, and any other shape may be employed. For example, as shown in FIG. 11A, the shape of second opening (14b) may be oval. In such a case, width (R2) of second opening (14b) corresponds to the major axis. Also, as shown in FIG. 11B, for example, second opening (14b) may also be shaped to have four sides. In such a case, width (R2) of second opening (14b) corresponds to the diagonal distance. Other than such, second opening (14b) may also be shaped as a triangle, or as a polygon such as one with six sides.

Figure 12A:
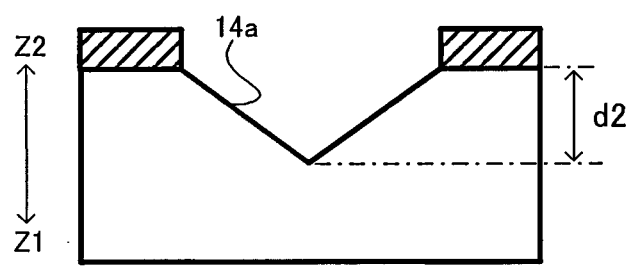
FIG. 12A is a view showing a first modified example of a shape of a second hole.
Figure 12B:
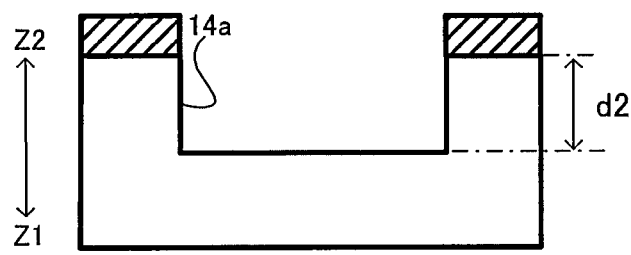
FIG. 12B is a view showing a second modified example of a shape of a second hole.

The wall surface of second hole (14a) is not limited to be curved, as shown in FIG. 10C. For example, as shown in FIG. 12A, it may be inclined. Namely, tapering of second hole (14a) from the second surface of insulative substrate 11 toward the first surface includes cases in which the diameter of second hole (14a) decreases in a straight line from the second surface toward the first surface. In addition, second hole (14a) is not required to be tapered; for example, as shown in FIG. 12B, the wall surfaces of second hole (14a) may be perpendicular to the second surface of substrate 100 with conductive layers.

A method for forming tapered second hole (14a) is basically the same as that for first hole (13a). Namely, as shown in FIG. 9 previously, for example, by directly irradiating conductive layer 1002 with a laser, tapered second hole (14a) may be formed. Other than such, using examples shown in FIGS. 8A and 8B, tapered second hole (14a) may also be formed in the second-surface side of substrate 100 with conductive layers.

Figure 13:
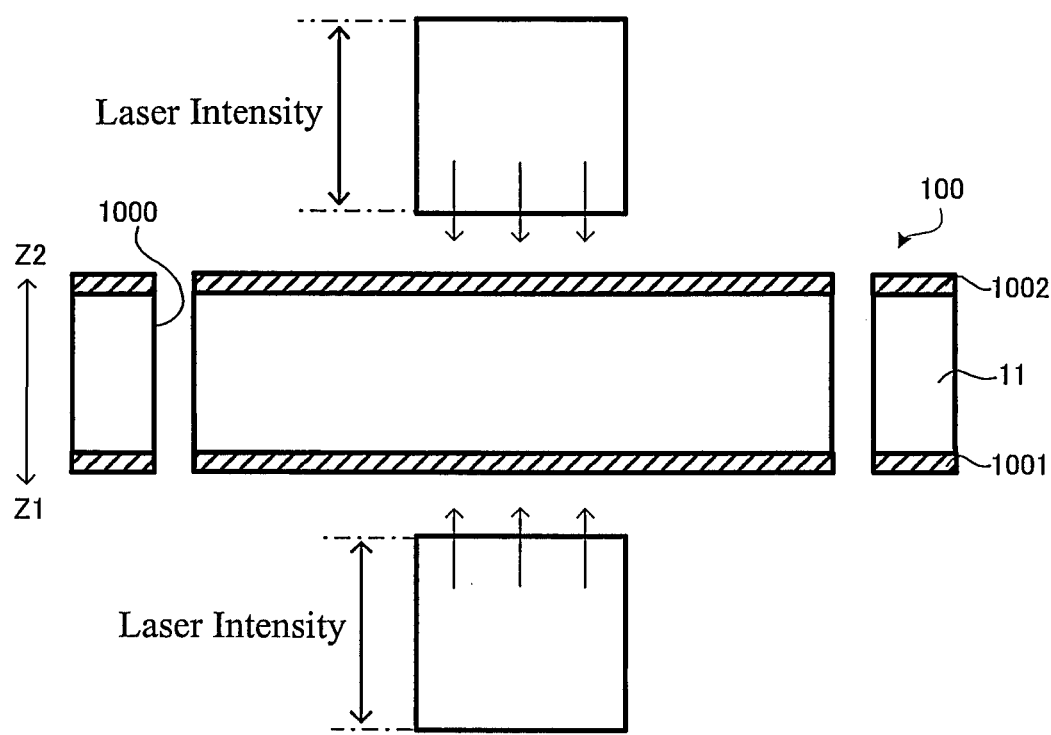
FIG. 13 is a view showing an example in which a first hole and a second hole are simultaneously formed.

In the present embodiment, after first hole (13a) (FIG. 4) is formed, substrate 100 with conductive layers is inverted and then second hole (14a) (FIG. 9) is formed. However, the present embodiment is not limited to such. For example, as shown in FIG. 13, by irradiating a laser from both the first surface and the second surface of substrate 100 with conductive layers, first hole (13a) and second hole (14a) may be formed simultaneously.

Figure 14:
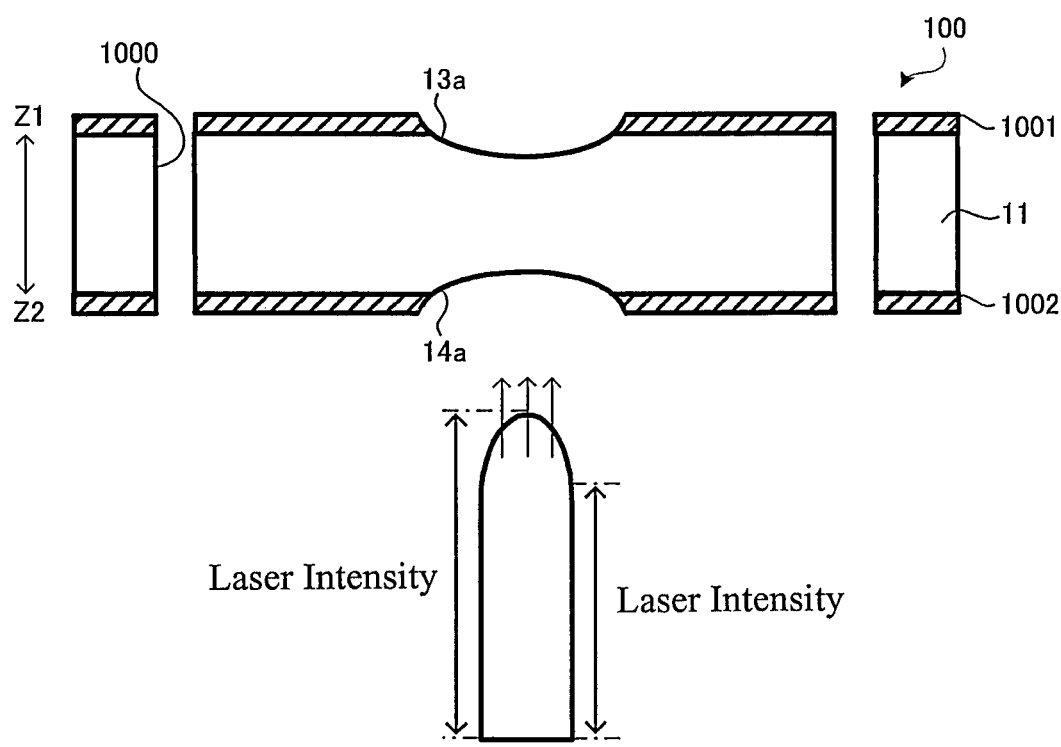
FIG. 14 is a view illustrating a step to form a third hole which connects a first hole and a second hole.
Figure 15A:
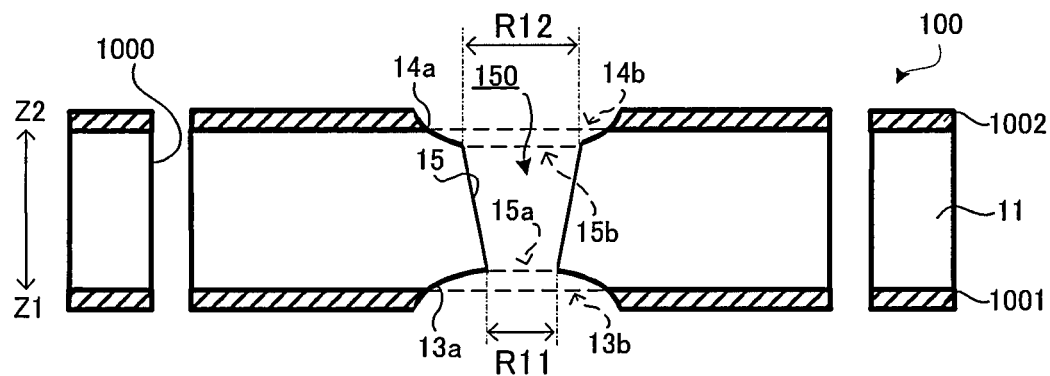
FIG. 15A is a cross-sectional view of a substrate where a third hole is formed.

Next, as shown in FIG. 14, from the second-surface side of insulative substrate 11, a laser is irradiated on insulative substrate 11 exposed through second opening (14b) of second hole (14a). The position at which a laser is irradiated is inside first opening (13b) of first hole (13a), and the laser is irradiated according to alignment marks 1000. As for such a laser, for example, $CO_2$ laser or UV-YAG (Ultraviolet-Visible-Yttrium-Aluminum-Garnet) laser or the like may be used. In doing so, as shown in FIG. 15A, third hole 15 is formed.

By forming third hole 15, penetrating hole 150 made up of first hole (13a), second hole (14a) and third hole 15 is formed. Since first hole (13a) and second hole (14a) are connected by third hole 15, the sum of depth (d1) of first hole (13a) and depth (d2) of second hole (14a) is preferred to be smaller than the thickness of insulative substrate 11. Since penetrating hole 150 is formed with first hole (13a), second hole (14a) and third hole 15, the sum of the depth of first hole (13a), the depth of second hole (14a) and the depth of third hole 15 is preferred to be greater than the thickness of insulative substrate 11.

Then, a desmearing treatment is performed. By doing so, smears remaining in penetrating hole 150 or the like are removed. Here, drilling (forming third hole 15) may also be conducted from the first-surface side.

The spot to irradiate with a laser is aligned with a position designed for a penetrating hole according to alignment marks 1000. Namely, a laser is irradiated so as to connect second hole (14a) and first hole (13a). By doing so, first hole (13a) and second hole (14a) are connected by third hole 15, and penetrating hole 150 which penetrates substrate 100 with conductive layers is formed. Since first hole (13a), second hole (14a) and third hole 15 are formed based on the same alignment marks 1000, the positional accuracy of those three holes is enhanced.

Figure 15B:
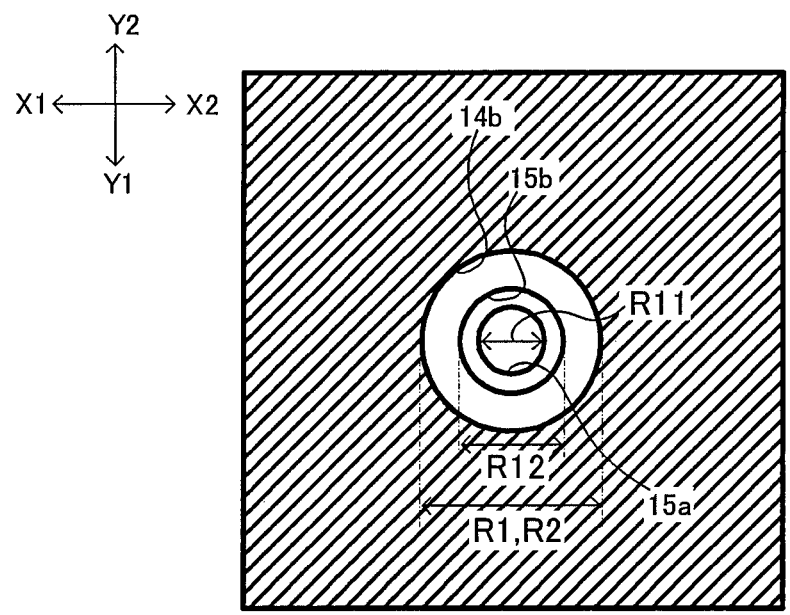
FIG. 15B is a plan view of a substrate where a third hole is formed.

Third opening (15a) and fourth opening (15b) of third hole 15 are each circular-shaped, for example, as shown in FIG. 15B (plan view). Width (R11) (diameter) of third opening (15a) is preferred to be 20-30 μm, and width (R12) (diameter) of fourth opening (15b) is preferred to be 40-70 μm. The ratio of (R11) to (R1) (R1/R11) is preferred to be 1.5-5. The ratio of (R12) to (R2) (R2/R12) is preferred to be 1.1-2.5. Within such ranges, first hole (13a) and second hole (14a) may be easily connected by third hole 15.

As shown in FIG. 15A previously, third hole 15 is tapered. In the present embodiment, the wall surface of third hole 15 is inclined. Namely, tapering of third hole 15 from the second surface of insulative substrate 11 toward the first surface includes cases in which the diameter of third hole 15 decreases in a straight line from the second surface toward the first surface.

Figure 16A:
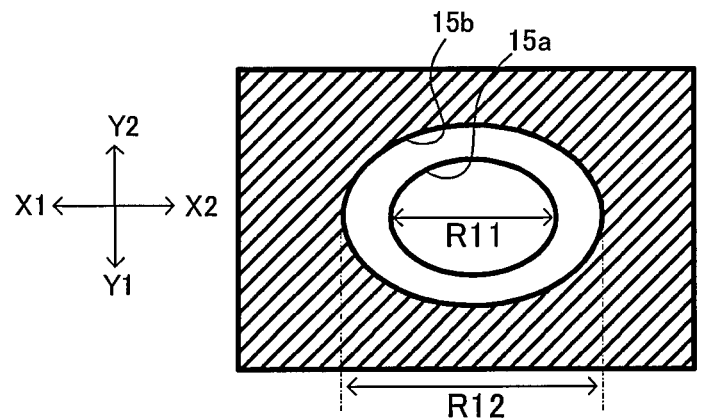
FIG. 16A is a view showing a first modified example of an opening of a third hole.
Figure 16B:
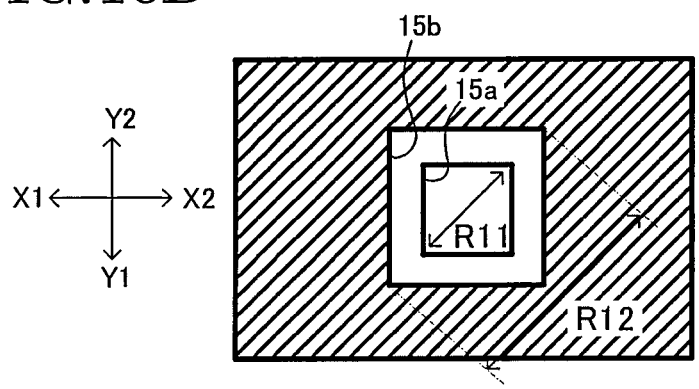
FIG. 16B is a view showing a second modified example of an opening of a third hole.
Figure 16C:
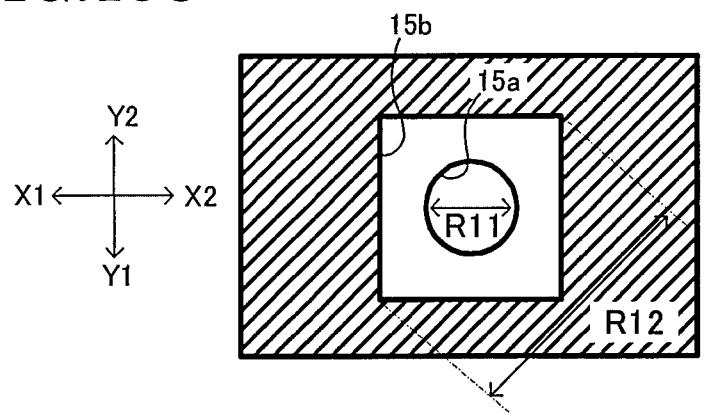
FIG. 16C is a view showing a third modified example of an opening of a third hole.

The shapes of third opening (15a) and fourth opening (15b) of third hole 15 are not limited to being circular such as shown in FIG. 15B, and any other shape may be employed. For example, as shown in FIG. 16A, third opening (15a) and fourth opening (15b) of third hole 15 may have oval shapes. In such a case, width (R11) of third opening (15a) and width (R12) of fourth opening (15b) correspond to their respective major axes. Also, as shown in FIG. 16B, for example, third opening (15a) and fourth opening (15b) may be shaped to have four sides. In such a case, width (R11) of third opening (15a) and width (R12) of fourth opening (15b) correspond to their diagonal distance. Other than those, third opening (15a) and fourth opening (15b) may also be shaped as triangles, or polygons such as those with six sides. Furthermore, as shown in FIG. 16C, third opening (15a) and fourth opening (15b) may be shaped differently from each other.

Figure 17A:
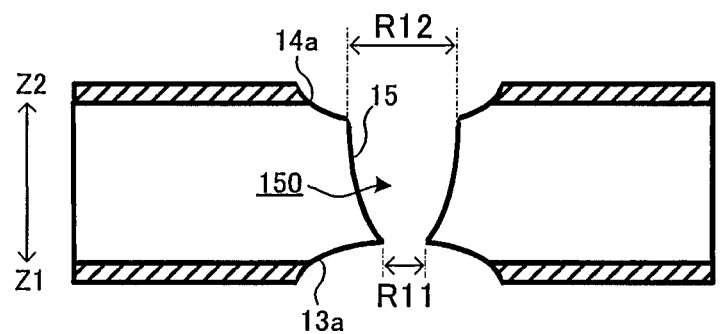
FIG. 17A is a view showing a first modified example of a shape of a third hole.
Figure 17B:
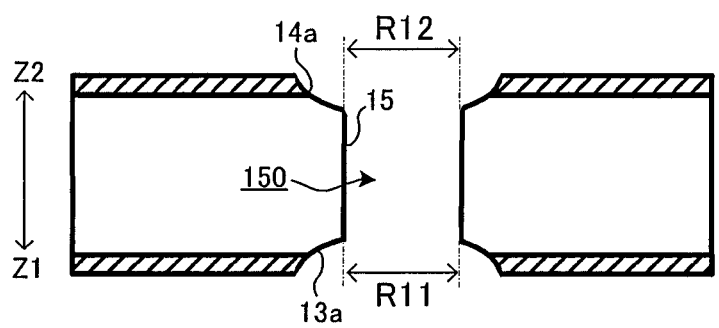
FIG. 17B is a view showing a second modified example of a shape of a third hole.

The wall surface of third hole 15 is not limited to being inclined such as shown in FIG. 15A. For example, as shown in FIG. 17A, the wall surface of third hole 15 may be a curve with a width (diameter) that gradually decreases from the second surface of insulative substrate 11 toward the first surface. Namely, tapering of third hole 15 from the second surface of insulative substrate 11 toward the first surface includes cases in which the width of third hole 15 gradually narrows from the second surface of insulative substrate 11 toward the first surface. In addition, third hole 15 is not required to be tapered; for example, as shown in FIG. 17B, the wall surface of third hole 15 may be perpendicular to the first surface and the second surface respectively of insulative substrate 11. In such a case, width (R11) of third opening (15a) and width (R12) of fourth opening (15b) become equal.

Figure 18A:
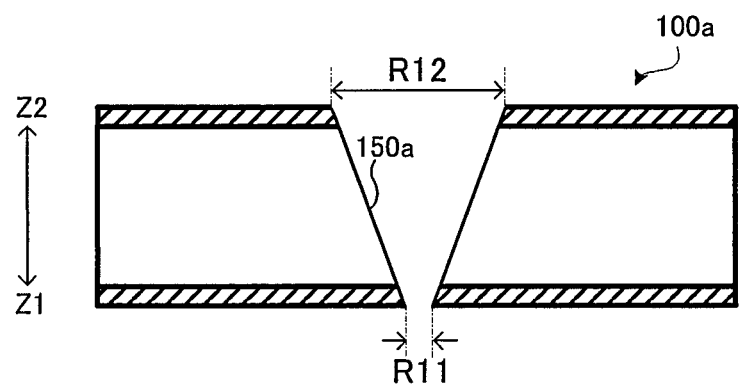
FIG. 18A is a view showing a state where a tapered penetrating hole is formed in a substrate according to a comparative example.
Figure 18B:
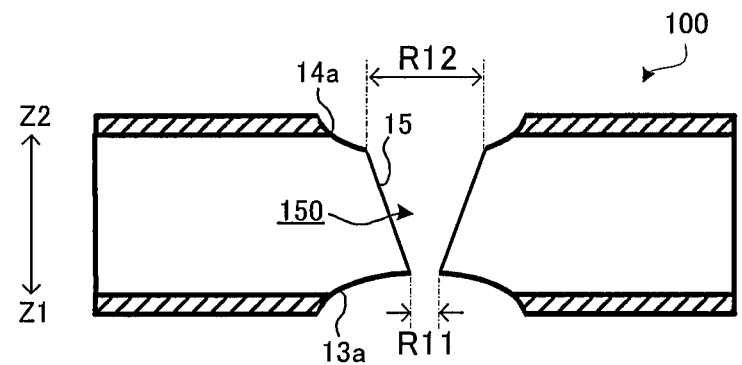
FIG. 18B is a view showing a state where a tapered third hole is formed in a substrate according to an embodiment of the present invention.

As described above, in the present embodiment, after first hole (13a) and second hole (14a) are formed, third hole 15 connecting such holes will be formed. Therefore, by irradiating a laser from both surfaces of substrate 100 with conductive layers when forming penetrating hole 150 in the present embodiment, penetrating hole 150 which penetrates substrate 100 with conductive layers may be formed more easily than in cases in which neither first hole (13a) nor second hole (14a) is formed in substrate (100a) with conductive layers (FIG. 18A). According to the method of the present embodiment, first hole (13a) and second hole (14a) are connected by third hole 15, which is narrower than first hole (13a) or second hole (14a). Thus, as shown in FIG. 18B, the diameter (the diameter of (R1) or (R2), whichever is greater) of penetrating hole 150 may be set smaller. Accordingly, the pitch between penetrating holes 150 becomes smaller, and the impedance of a printed wiring board of the present embodiment will decrease. In the same manner, when forming penetrating hole 150 which penetrates insulative substrate 11 by irradiating a laser from the first surface and the second surface of insulative substrate 11, penetrating hole 150 of the present embodiment may be formed more easily than in cases in which neither first hole (13a) nor second hole (14a) is formed in insulative substrate 11.

Figure 19A:
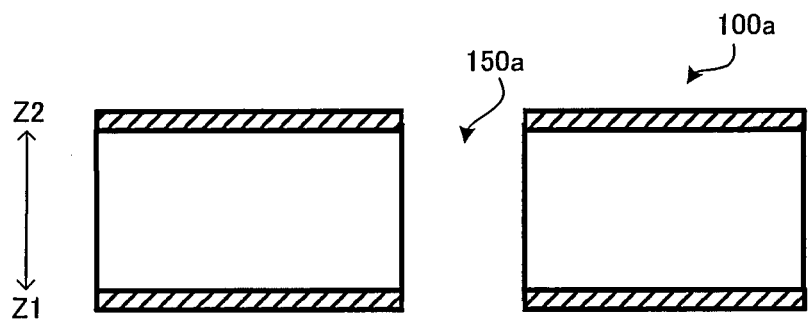
FIG. 19A is a view showing a shape of a penetrating hole in a substrate according to a comparative example.
Figure 19B:
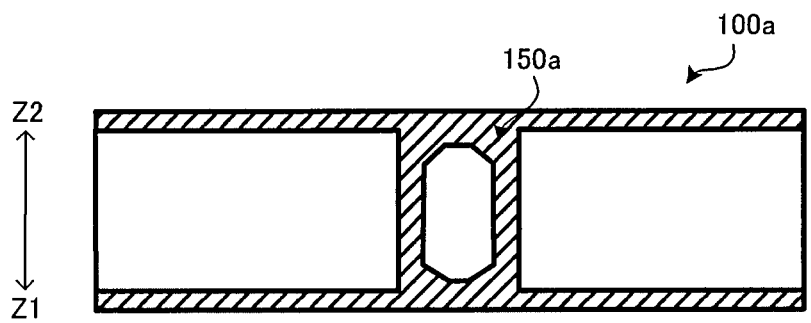
FIG. 19B is a view showing a state where a penetrating hole of a substrate in a comparative example is filled with plating.

Moreover, in penetrating hole (150a) having neither first hole (13a) nor second hole (14a) (see FIG. 19A), voids tend to remain in the through-hole conductor, as shown in FIG. 19B. Thus, voids will occur easily. By contrast, in the present embodiment, since first hole (13a) and second hole (14a), larger than third hole 15, are formed respectively in the first-surface side and the second-surface side of insulative substrate 11, it is easier to fill penetrating hole 150 of the present embodiment with plating compared with penetrating hole (150a).

As for a method for forming third hole 15, methods may be employed such as forming third hole 15 by drilling (such as laser irradiation) from both surfaces (first surface and second surface) of substrate 100 with conductive layers. However, in such a case, the spot to irradiate a laser from the first surface needs to be aligned highly accurately with the spot to irradiate a laser from the second surface. Thus, accuracy is strictly required when aligning drilling spots. By contrast, in the present embodiment, since drilling is conducted from one side only, such a high degree of accuracy will not be required.

Figure 20A:
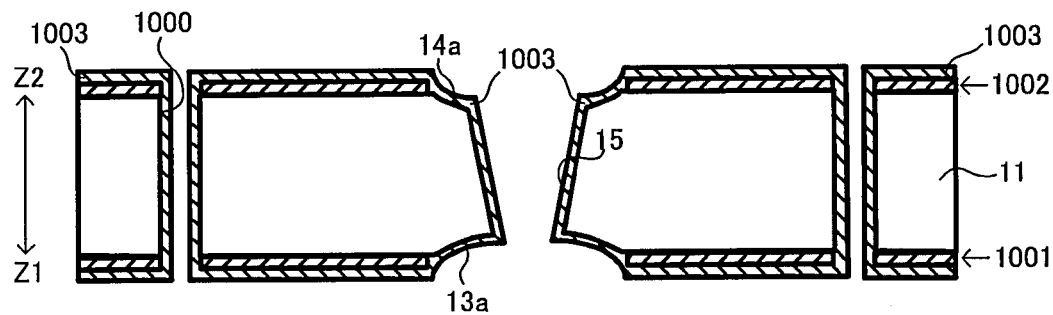
FIG. 20A is a view illustrating a step to form electroless plated film.

Next, a catalyst such as Pd is formed so that plating will be deposited on the substrate surfaces including the wall surfaces of penetrating hole 150. Then, as shown in FIG. 20A, by electroless plating, for example, electroless plated film 1003 is formed on the substrate surfaces including the wall surfaces of penetrating hole 150. As material for electroless plated film 1003, copper, nickel, titanium, chrome or the like may be used. Other than electroless plated film, examples using sputtered film or CVD film may be listed. When using sputtered film or CVD film, catalysts are not required. In the present embodiment, electroless copper plating is performed and electroless copper-plated film is formed on the substrate surfaces including the wall surfaces of penetrating hole 150.

Figure 20B:
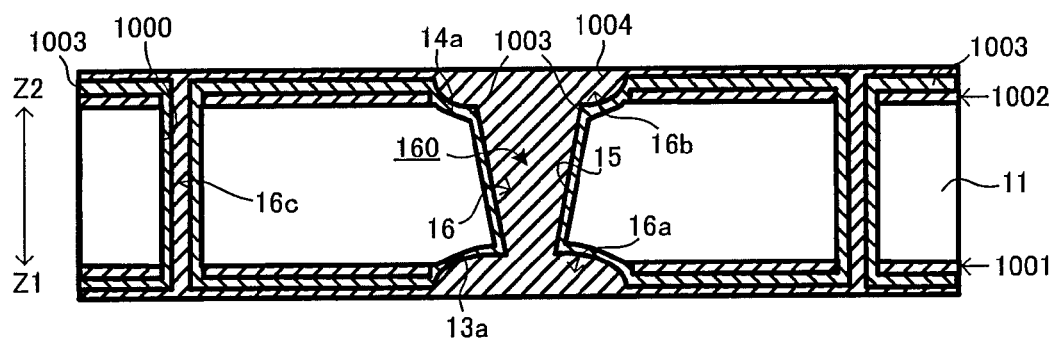
FIG. 20B is a view illustrating a step to form electrolytic plated film.

Next, using electroless plated film 1003 as a seed layer, electrolytic plating is performed, for example. By doing so, as shown in FIG. 20B, electrolytic plated film 1004 is formed, for example. As material for electrolytic plated film 1004, copper, nickel, solder or the like may be used. In the present embodiment, electrolytic copper-plated film is formed on the seed layer by electrolytic copper plating. When a catalyst works as seed, a seed layer such as electroless plated film or sputtered film is not required. Electrolytic plated film may be formed through a catalyst on the substrate surfaces including the wall surfaces of penetrating hole 150.

Electrolytic plated film 1004 is filled in first hole (13a), second hole (14a) and third hole 15. At the same time, conductive film such as electrolytic plated film 1004 is formed on the first and second surfaces of insulative substrate 11. The conductive film formed on the first surface of insulative substrate 11 is the first conductive film, and the conductive film formed on the second surface of insulative substrate 11 is the second conductive film. In the present embodiment, electrolytic plated film 1004 is formed on the first and second surfaces of insulative substrate 11 by means of conductive layers (1001, 1002) and the seed layers.

Through-hole conductor 160 is formed with conductor which fills first hole (13a), second hole (14a) and third hole 15. In the present embodiment, through-hole conductor 160 is made of electrolytic copper plating. As for through-hole conductor 160, other than plating, conductive paste may also be used. When using conductive paste, seed layers are not required. As for conductive material dispersed in conductive paste, conductive particles of copper or silver which are coated with solder are preferred. Through-hole conductor 160 is used for electrical continuity, for example, between the conductive pattern on the first surface of insulative substrate 11 and the conductive pattern on the second surface of insulative substrate 11. Conductor (16c) is also formed in alignment marks (penetrating holes) 1000.

Next, electrolytic plated film 1004 on the surfaces of insulative substrate 11 is patterned by etching, for example. In doing so, conductive patterns (12a, 12b) are formed respectively on the first and second surfaces of insulative substrate 11. Accordingly, printed wiring board 10 is completed (see FIG. 1A). Conductive pattern (12a) on the first surface and conductive pattern (12b) on the second surface are electrically connected by means of through-hole conductor 160.

After external processing, warping correction, conductivity inspection, exterior inspection, final inspection and so forth, printed wiring boards 10 become final products.

Examples

Figure 21:
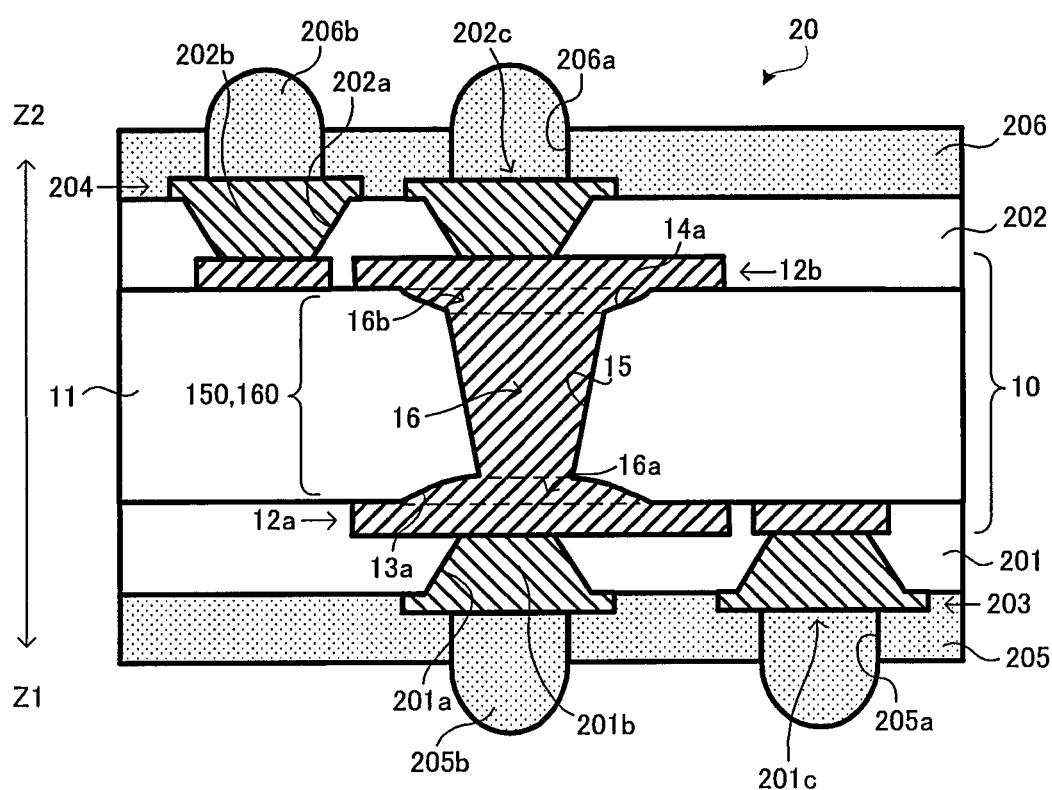
FIG. 21 is a cross-sectional view of a multilayer printed wiring board manufactured using a double-sided circuit board according to an embodiment of the present invention.

By using printed wiring board 10 as a core substrate, a built-up printed wiring board may be manufactured. In such a case, the material, dimensions or other factors for insulative substrate 11 are preferred to be selected so that the following are satisfied: strength capable of supporting built-up layers and components, heat resistance, appropriate thermal expansion coefficients, dimensional stability and resistance against warping or twisting which are required to form upper layers. FIG. 21 shows multilayer printed wiring board 20 manufactured using printed wiring board 10.

Multilayer printed wiring board 20 has the following: printed wiring board 10; insulation layers (201, 202) laminated on the first and second surfaces of printed wiring board 10; conductive patterns (203, 204) formed on insulation layers (201, 202); via conductor (201b) electrically connecting conductive pattern (12a) and conductive pattern 203; via conductor (202b) electrically connecting conductive pattern (12b) and conductive pattern 204; solder-resist layers (205, 206) having openings (205a, 206a) which expose solder pads (201c, 202c) (part of conductive patterns (203, 204)); and solder bumps (205b, 206b) formed on solder pads (201c, 202c). Conductive patterns (203, 204) work as circuits, for example.

A method for manufacturing multilayer printed wiring board 20 is described in the following.

Figure 22A:
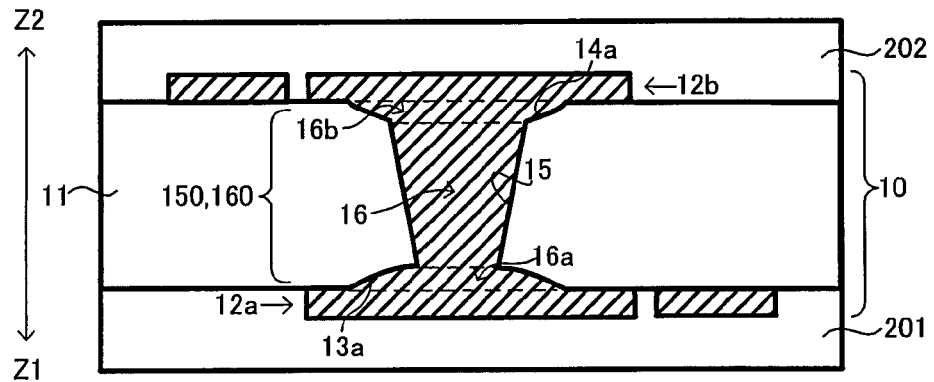
FIG. 22A is a view illustrating a first step to manufacture a multilayer printed wiring board.

First, using printed wiring board 10 as a core substrate, insulation layers (201, 202) are formed on both surfaces (first and second surfaces) of printed wiring board 10, as shown in FIG. 22A. The first surface and second surface of printed wiring board 10 are opposite each other. Specifically, for example, insulative film (ABF series made by Ajinomoto Fine-Techno Co., Inc.) is laminated on both surfaces of printed wiring board 10, and then by thermosetting such insulative film, insulation layers (201, 202) are formed.

Figure 22B:
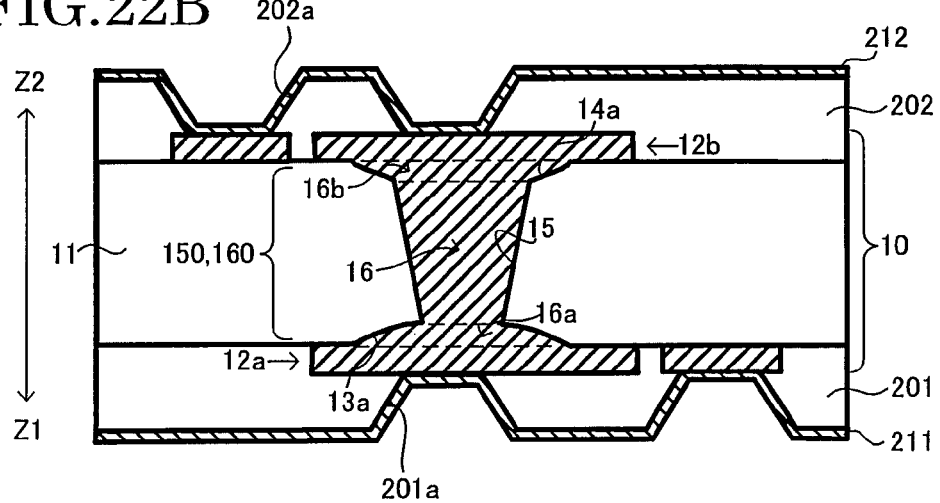
FIG. 22B is a view illustrating a second step to manufacture a multilayer printed wiring board.
Figure 22C:
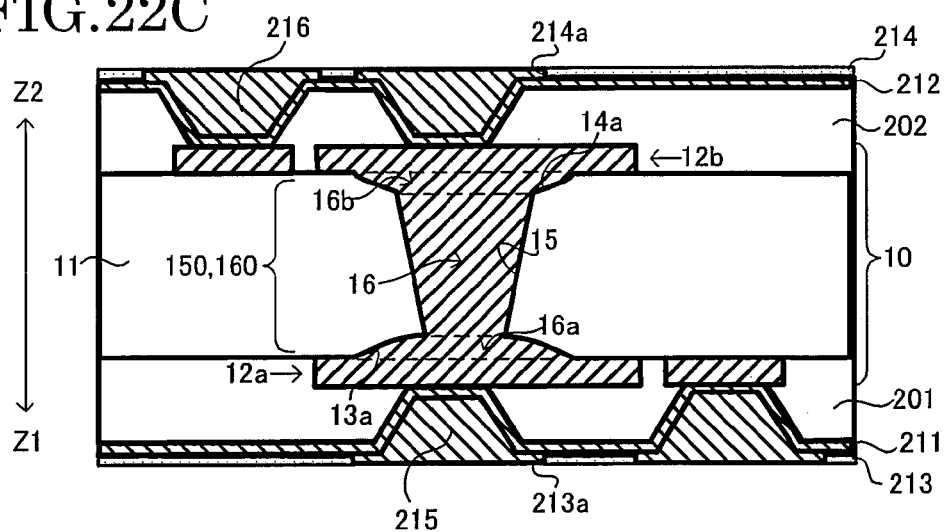
FIG. 22C is a view illustrating a third step to manufacture a multilayer printed wiring board.

Next, as shown in FIG. 22B, insulation layers (201, 202) are irradiated with a laser, for example, to form via holes (201a, 202a) reaching conductive patterns (12a, 12b) or through-hole conductor 160. Then, electroless plated films (211, 212) made of copper, for example, are formed on the wall surfaces of via holes (201a, 202a) and on insulation layers (201, 202). As material for such electroless plating, other than copper, nickel may be used, for example. Instead of electroless plating, sputtered film may also be used. Electroless plated film or sputtered film works as a seed layer. Next, as shown in FIG. 22C, plating resists (213, 214) having openings (213a, 214a) are formed on electroless plated films (211, 212). Then, electrolytic plated film (215, 216) made of copper, for example, are formed on electroless plated films (211, 212) exposed through openings (213a, 214a). As the material for electrolytic plating, other than copper, nickel or the like may be used. After that, plating resists (213, 214) are removed.

Figure 23A:
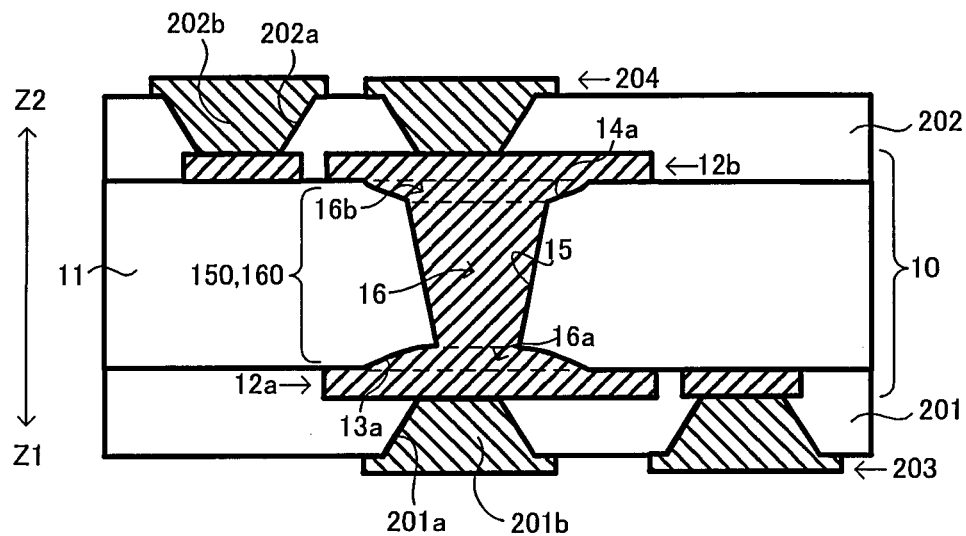
FIG. 23A is a view illustrating a fourth step to manufacture a multilayer printed wiring board.

Next, electroless plated films (211, 212) left exposed by electrolytic plated films (215, 216) are removed by etching, for example. By doing so, as shown in FIG. 23A, conductive patterns (203, 204) and via conductors (201b, 202b) are formed, made of electroless plated films (211, 212) and electrolytic plated films (215, 216). Via conductors (201b, 202b) are preferred to be filled vias such as via holes (201a, 202a) filled with plated film. Here, if sputtered film is used as a seed layer, conductive patterns (203, 204) and via conductors (201b, 202b) are formed, made of sputtered film and electrolytic plated film on the sputtered film.

By repeating the above steps, from forming insulation layers (210, 202) to patterning, the same number of times as the number of layers to be laminated, a multilayer printed wiring board may be manufactured having further layers than multilayer printed wiring board 20 shown in FIG. 21.

Figure 23B:
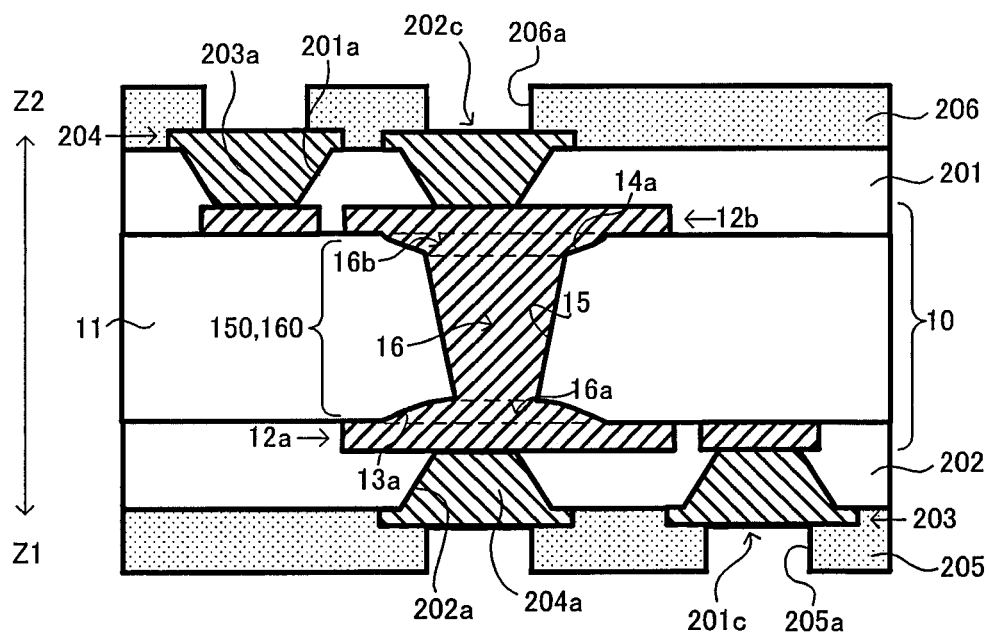
FIG. 23B is a view illustrating a fifth step to manufacture a multilayer printed wiring board.

Next, on both surfaces (first and second surfaces) of the substrate, liquid or dry film photosensitive resist (solder resist) is applied or laminated. Then, a mask film with a predetermined pattern is adhered on the photosensitive resist surface, which is then exposed to ultraviolet rays and developed with an alkaline solution. As a result, as shown in FIG. 23B, solder-resist layers (205, 206) are formed which have openings (205a, 206a) to expose solder pads (201c, 202c) corresponding to parts of conductive patterns (203, 204). Openings (205a, 206a) may also expose at least part of the via conductors. Thermosetting-type solder resist may also be used.

Next, solder paste is printed on solder pads (201c, 202c). Instead of solder paste, solder balls may be mounted on solder pads. Then, reflow is conducted to form solder bumps (205b, 206b) as shown in FIG. 21 previously. Accordingly, multilayer printed wiring board 20 is completed. Multilayer printed wiring board 20 will be electrically connected to electronic components such as an IC chip, or to a daughter-board or the like by means of solder bumps (205b, 206b).

So far, a substrate with conductive layers and its manufacturing method according to an embodiment of the present invention have been described. However, the present invention is not limited to such. For example, the present invention may also be employed after making the following modifications.

In the above embodiment, the position, size and shape of each hole, and the material, size, pattern, number of layers and so forth of each layer may be modified freely within a scope that does not deviate from the gist of the invention.

For example, in the above embodiment, first hole (13a) and second hole (14a) are formed to have the same shape and the same dimensions and are positioned to be opposite each other. However, the present invention is not limited to such. For example, first hole (13a) and second hole (14a) may be shaped differently, and may have different dimensions.

Furthermore, first hole (13a) and second hole (14a) may be positioned to be shifted (offset) from each other. FIG. 24 shows penetrating hole (150b) where straight line (L1) does not coincide with straight line (L2). In penetrating hole (150b), since the first joined portion is not parallel to the first surface, (D1) is the distance from the first surface to a spot on the first joined portion that is closest to the first surface; and since the second joined portion is not parallel to the second surface, (D2) is the distance from the second surface to a spot on the second joined portion that is closest to the second surface. Also, (d3) is the maximum value of the distance between the first joined portion and the second joined portion. Since first hole (13a) and second hole (14a) are offset in penetrating hole (150b), the length of third hole 15, which is narrower than first hole (13a) or second hole (14a), tends to increase, compared with penetrating hole 150 where the position of first hole (13a) overlaps the position of second hole (14a) (cases in which straight line (L1) coincides with straight line (L2)). Therefore, it is thought that reliability in through-hole conductor 160 will be enhanced. Since third hole 15 is narrow, if warping occurs in a printed wiring board, it is thought that through-hole conductor 160 will tend to follow the warping of the substrate. As a result, it is thought that through-hole conductor 160 will seldom be damaged.

The order of the steps in the above embodiment may be modified within a scope that does not deviate from the gist of the present invention. Also, unnecessary steps may be omitted according to requirements.

In the above embodiment, substrate 100 with conductive layers is used as a starting substrate. However, the present invention is not limited to such. For example, insulative substrate 11 without conductive layers may be used as a starting substrate. When insulative substrate 11 is a starting material, printed wiring board 10 may be formed by the same method that uses substrate 100 with conductive layers as a starting material. When insulative substrate 11 is a starting material, conductive patterns formed on insulative substrate 11 are made of seed layers and electrolytic plated film. When a catalyst works as seed, conductive patterns formed on insulative substrate 11 are made of electrolytic plated film.

Figure 25:
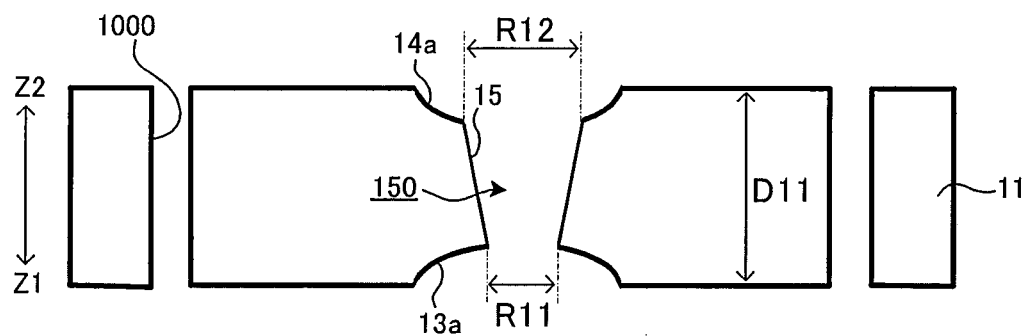
FIG. 25 is a view showing an example of a board manufactured using an insulative substrate without conductive layers as its starting substrate.

Also, as shown in FIG. 25, first hole (13a), second hole (14a) and third hole 15 may be formed by directly irradiating a laser at insulative substrate 11 where no conductive layer is formed. In such a case, a method is especially effective in which insulative substrate 11 is irradiated using a laser whose energy is greater in the center than on the periphery (see FIG. 8B). By such a method, tapered first hole (13a), second hole (14a) and third hole 15 may be easily formed.

A method for forming first hole (13a), second hole (14a) and third hole 15 is not limited to using a laser, and any other method may be employed. For example, using a drill or the like, such holes may also be formed. However, using a laser is preferred to form first hole (13a), second hole (14a) and third hole 15 with a high degree of accuracy.

A method for plating is not limited to such as shown in the above embodiment, and any other method may be employed. In the following, another example of plating is shown.

Insulative substrate 11, having penetrating hole 150 formed through the steps shown in FIGS. 2-4, FIGS. 9, 14, 20A and others, is immersed in electrolytic plating solution (1004a). In insulative substrate 11, it is preferred that seed layers be formed on the surfaces including the inner walls of penetrating hole 150. However, if a catalyst works as seed, such seed layers are not required. As for electrolytic plating solution (1004a), for example, a commercially available electrolytic copper plating solution may be used.

Figure 26A:
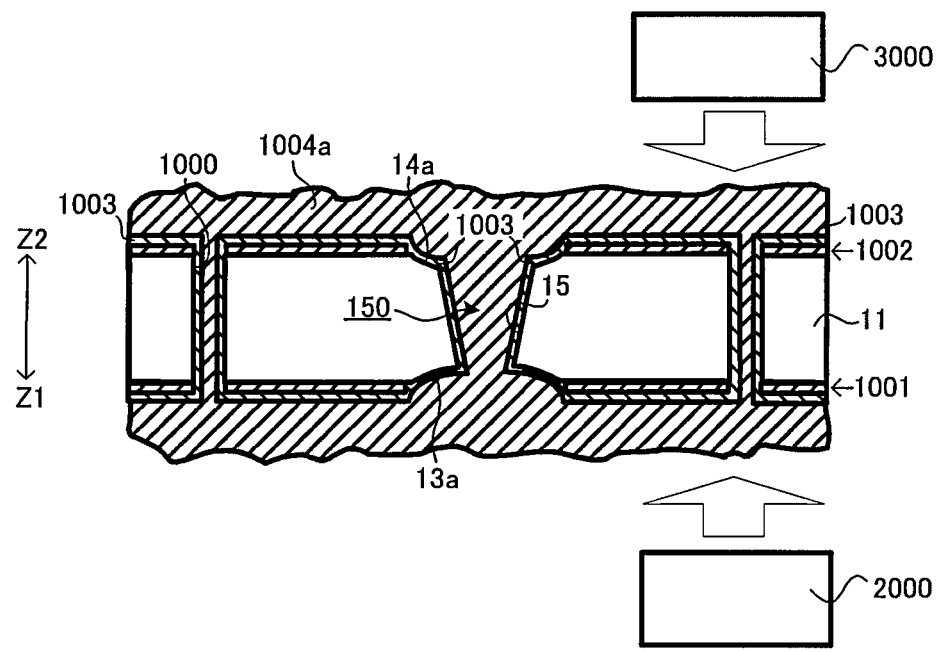
FIG. 26A is a view illustrating a first step of a modified example of a plating method for forming a through-hole conductor.

After that, as shown in FIG. 26A, insulative body 2000 is pressed against the first surface of insulative substrate 11; and insulative body 3000 is pressed against the second surface of insulative substrate 11. As for insulative bodies (2000, 3000), sponges, brushes or the like may be used. In FIG. 26A, sponges (insulative bodies (2000, 3000)) are pressed against the seed layers. If a catalyst works as seed, and if the starting material is substrate 100 with conductive layers, such sponges are pressed against conductive layers such as copper foil; and if the starting material is insulative substrate 11, such sponges are pressed against the insulative substrate.

Figure 26B:
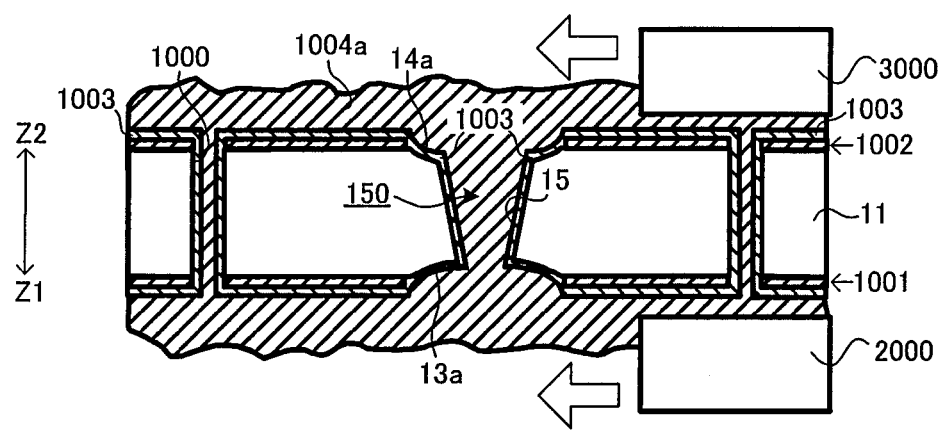
FIG. 26B is a view illustrating a second step of a modified example of a plating method for forming a through-hole conductor.

Next, as shown in FIG. 26B, at least either insulative substrate 11 or insulative bodies (2000, 3000) are moved. Namely, insulative substrate 11 and insulative bodies (2000, 3000) move in the opposite direction from each other. In doing so, electroless plated film 1003 or the catalyst becomes a seed layer, and electrolytic plated film 1004 (FIG. 20B) is formed on insulative substrate 11.

Using such a method, the thickness of conductive film (conductive patterns (12a, 12b)) formed respectively on the first surface and the second surface becomes thinner, compared with electrolytic plating in which insulative bodies (2000, 3000) are not used. In addition, since electrolytic plated film 1004 is formed while insulative bodies (2000, 3000) are pressed against insulative substrate 11, adhesiveness tends to increase between insulative substrate 11 and conductive layers. Accordingly, penetrating hole 150 may be easily filled with electrolytic plated film.

Prior to performing plating, surface treatments using graft polymers or the like may be conducted on the surfaces of plated films. When the starting material is insulative substrate 11, adhesive strength will be especially high between insulative substrate 11 and plated films.

Any method may be used when forming each conductive layer. However, when forming conductive patterns such as conductive circuits, it is preferred to use semi-additive methods or subtractive methods well known in the field of printed wiring boards.

The first surface and the second surface in the above embodiment may be reversed.

A method for manufacturing a double-sided circuit board according to one aspect of the present invention includes the following: preparing a substrate designating one surface of the upper and lower surfaces as a first surface and the other as a second surface; forming a first hole in the first-surface side of the substrate; forming a second hole in the second-surface side of the substrate; by forming in the substrate a third hole that connects the first hole and the second hole, forming in the substrate a penetrating hole made up of the first hole, the second hole and the third hole; forming a first conductive circuit on the first surface of the substrate; forming a second conductive circuit on the second surface of the substrate; and by filling the penetrating hole with conductive material, forming a through-hole conductor to electrically connect the first conductive circuit and the second conductive circuit. In such a method, the first hole has a first opening with a diameter (R1) on the first surface of the substrate, the second hole has a second opening with a diameter (R2) on the second surface of the substrate, and the diameter of the third hole is smaller than (R1) or (R2).

Other than purchasing material and components and manufacturing by oneself accordingly, "preparing" includes purchasing finished products and using them.

A double-sided circuit board according to the second aspect of the present invention is formed with the following: a substrate having a first surface and a second surface opposite the first surface and having a penetrating hole for a through-hole conductor; a first conductive circuit formed on the first surface of the substrate; a second conductive circuit formed on the second surface of the substrate; and a through-hole conductor formed in the penetrating hole and electrically connecting the first conductive circuit and the second conductive circuit. In such a double-sided circuit board, the penetrating hole is made up of a first hole formed in the first-surface side of the substrate, a second hole formed in the second-surface side of the substrate, and a third hole connecting the first hole and the second hole and formed inside the substrate, the first hole has a first opening with a diameter (R1) on the first surface of the substrate, the second hole has a second opening with a diameter (R2) on the second surface of the substrate, and the diameter of the third hole is smaller than (R1) or (R2).

Obviously, numerous modifications and variations of the present invention are possible in light of the above teachings. It is therefore to be understood that within the scope of the appended claims, the invention may be practiced otherwise than as specifically described herein.

What is claimed is:

1. A double-sided circuit board comprising:
   a substrate layer having a first surface and a second surface on an opposite side of the first surface and having a penetrating hole extending between the first surface and the second surface;
   a first conductive circuit formed on the first surface of the substrate layer;
   a second conductive circuit formed on the second surface of the substrate layer; and
   a through-hole conductor formed in the penetrating hole of the substrate layer and electrically connecting the first conductive circuit and the second conductive circuit,
   wherein the penetrating hole comprises a first hole having a first opening with a diameter R1 on the first surface of the substrate layer such that a portion of the through-hole conductor in the first hole is connected to the first conductive circuit, a second hole having a second opening with a diameter R2 on the second surface of the substrate layer such that a portion of the through-hole conductor formed in the second hole is connected to the second conductive circuit, and a third hole connecting the first hole and the second hole, having a diameter smaller than at least one of R1 and R2 and tapering from the first surface of the substrate layer toward the second surface.

2. The double-sided circuit board according to claim 1, wherein the first hole has a depth d1, the second hole has a depth d2, and the depth d1 and the depth d2 produce a sum which is smaller than a thickness of the substrate layer.

3. The double-sided circuit board according to claim 2, wherein the first hole and second hole each independently have a depth which is less than half a thickness of the substrate layer, and the depth d1, the depth d2 and a depth of the third hole produce a sum which is greater than the thickness of the substrate layer.

4. The double-sided circuit board according to claim 3, wherein the first hole is tapered from the first surface of the substrate layer toward the second surface.

5. The double-sided circuit board according to claim 3, wherein the second hole is tapered from the second surface of the substrate layer toward the first surface.

6. The double-sided circuit board according to claim 3, wherein the first hole is tapered from the first surface of the substrate layer toward the second surface, and the second hole is tapered from the second surface of the substrate layer toward the first surface.

7. The double-sided circuit board according to claim 3, wherein the first hole is formed in a tapered shape, and the second hole is formed in a tapered shape.

8. The double-sided circuit board according to claim 2, wherein the first hole is tapered from the first surface of the substrate layer toward the second surface.

9. The double-sided circuit board according to claim 2, wherein the second hole is tapered from the second surface of the substrate layer toward the first surface.

10. The double-sided circuit board according to claim 2, wherein the first hole is tapered from the first surface of the substrate layer toward the second surface, and the second hole is tapered from the second surface of the substrate layer toward the first surface.

11. The double-sided circuit board according to claim 2, wherein the first hole is formed in a tapered shape, and the second hole is formed in a tapered shape.

12. The double-sided circuit board according to claim 1, wherein the first hole is tapered from the first surface of the substrate layer toward the second surface.

13. The double-sided circuit board according to claim 1, wherein the second hole is tapered from the second surface of the substrate layer toward the first surface.

14. The double-sided circuit board according to claim 1, wherein the first hole is tapered from the first surface of the substrate layer toward the second surface, and the second hole is tapered from the second surface of the substrate layer toward the first surface.

15. The double-sided circuit board according to claim 1, wherein the first hole is formed in a tapered shape, and the second hole is formed in a tapered shape.

16. The double-sided circuit board according to claim 1, wherein the substrate layer comprises a resin material.

17. The double-sided circuit board according to claim 1, wherein the substrate layer comprises a resin material and a reinforcing material.

18. The double-sided circuit board according to claim 1, wherein the through-hole conductor comprises a plating material filling the penetrating hole of the substrate layer.

19. The double-sided circuit board according to claim 1, wherein the substrate layer comprises a resin material, and the through-hole conductor comprises a plating material filling the penetrating hole of the substrate layer.

20. The double-sided circuit board according to claim 1, wherein the substrate layer comprises a resin material and a reinforcing material, and the through-hole conductor comprises a plating material filling the penetrating hole of the substrate layer.

* * * * *